(12) United States Patent
Goh et al.

(10) Patent No.: US 10,923,415 B2
(45) Date of Patent: Feb. 16, 2021

(54) SEMICONDUCTOR PACKAGE HAVING INTEGRATED STIFFENER REGION

(71) Applicant: Intel Corporation, Santa Clara, CA (US)

(72) Inventors: Eng Huat Goh, Ayer Itam (MY); Jiun Hann Sir, Gelugor (MY); Min Suet Lim, Gelugor (MY); Shawna M. Liff, Scottsdale, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 16/328,231

(22) PCT Filed: Sep. 14, 2016

(86) PCT No.: PCT/US2016/051697
§ 371 (c)(1),
(2) Date: Feb. 25, 2019

(87) PCT Pub. No.: WO2018/052413
PCT Pub. Date: Mar. 22, 2018

(65) Prior Publication Data
US 2019/0214338 A1    Jul. 11, 2019

(51) Int. Cl.
*H01L 23/498* (2006.01)
*H01L 23/552* (2006.01)
(Continued)

(52) U.S. Cl.
CPC .... *H01L 23/49827* (2013.01); *H01L 21/4857* (2013.01); *H01L 23/00* (2013.01);
(Continued)

(58) Field of Classification Search
CPC ................................................. H01L 23/49827
(Continued)

(56) References Cited

U.S. PATENT DOCUMENTS 8,598,698 B1    12/2013  Lim
9,263,784 B2     2/2016  Inagaki et al.
(Continued)

FOREIGN PATENT DOCUMENTS

JP    2015213124 A    11/2015

OTHER PUBLICATIONS

International Search Report and Written Opinion for PCT Application No. PCT/US2016/051697, dated Jun. 7, 2017, 11 pages.

*Primary Examiner* — Walter H Swanson
(74) *Attorney, Agent, or Firm* — Eversheds Sutherland (US) LLP

(57) ABSTRACT

Semiconductor packages that mitigate warpage and/or other types or mechanical deformation of package substrates are provided. In some embodiments, a package substrate can include a peripheral conductive region having an assembly of rigid conductive members, such as metal layers, metal interconnects, or a combination thereof. The peripheral conductive region can be integrated into the package substrate during the manufacturing of the package substrate. In some implementations, lithographically defined conductive members can be leveraged to form extended conductive layers that can provide increased stiffness compared to nearly cylindrical conductive vias. Non-peripheral conductive regions also can be integrated into a semiconductor package in order to reduce specific patterns of mechanical deformations and/or to provide other functionality, such as electromagnetic interference (EMI) shielding.

18 Claims, 12 Drawing Sheets

(51) Int. Cl.
*H01L 23/00* (2006.01)
*H01L 21/48* (2006.01)
*H01L 23/538* (2006.01)

(52) U.S. Cl.
CPC .. *H01L 23/49816* (2013.01); *H01L 23/49822* (2013.01); *H01L 23/5383* (2013.01); *H01L 23/552* (2013.01); *H01L 23/562* (2013.01); *H01L 21/486* (2013.01)

(58) Field of Classification Search
USPC .................................................. 257/774
See application file for complete search history.

(56) References Cited

U.S. PATENT DOCUMENTS

| | | |
|---|---|---|
| 2014/0209215 A1 | 7/2014 | Chuang et al. |
| 2015/0061142 A1 | 3/2015 | Hsu et al. |
| 2016/0240481 A1 | 8/2016 | Chen et al. |

SEMICONDUCTOR PACKAGE HAVING INTEGRATED STIFFENER REGION

BACKGROUND

Warpage in semiconductor packaging is an issue. Metal stiffener is commonly used in order to improve package warpage. Yet, adding the metal stiffener can be costly not only in terms of increasing material and process cost, but it also can introduce top-side fit and/or Z-form-factor tradeoffs. Increasing demand for smaller, thinner, more highly integrated packages can render solutions including metal stiffeners less viable. Other approaches to address warpage can include overmolding or exposed die molding, but those approaches also can add costs associated with extra material and/or processing costs. Further, molding typically require strip design which usually causes tradeoffs on panel utilization, thus increasing the cost of package units and products, particularly for semiconductor packages larger than 17 mm×17 mm. Therefore, much remains to be improved in the design of and real estate utilization in semiconductor product assemblies including semiconductor packages and/or substrates that support a semiconductor package.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like, but not necessarily the same or identical, elements throughout.

In FIG. 3, the illustrated portion constitutes an example of a moat including continuous via layers defined lithographically, for example. In FIG. 4, the illustrated portion constitutes an example of a moat including non-continuous via layers defined by means of laser processing, such as laser ablation.

FIG. 9A illustrates an example of a core substrate in accordance with one or more embodiments of the disclosure;

FIG. 9B illustrates an example of perforations in the core substrate shown in FIG. 9A in accordance with one or more embodiments of the disclosure;

FIG. 9C illustrates an example of a metal coated substrate resulting from filling the perforations shown in FIG. 9B in accordance with one or more embodiments of the disclosure;

FIG. 9D illustrates an example of metal layers on respective surfaces of the metal coated substrate shown in FIG. 9C in accordance with one or more embodiments of the disclosure;

FIG. 9E illustrates an example of an dielectric coated substrate resulting from forming build-up layers on the metal layers shown in FIG. 9D;

FIG. 9F illustrates another example of perforations in the insulator coated substrate shown in FIG. 9E in accordance with one or more embodiments of the disclosure;

FIG. 9G illustrates an example of another metal coated substrate resulting from filling the perforations shown in FIG. 9F in accordance with one or more embodiments of the disclosure;

FIG. 9H illustrates an example of other metal layers on respective surfaces of the metal coated substrate shown in FIG. 9G in accordance with one or more embodiments of the disclosure; and FIG. 9I illustrates an example of the package substrate formed after subsequent treatment of the substrate shown in FIG. 9H in accordance with one or more embodiments of the disclosure.

FIG. 10A illustrates another example of perforations in the insulator coated substrate shown in FIG. 9E in accordance with one or more embodiments of the disclosure;

FIG. 10B illustrates an example of another metal coated substrate resulting from filling the perforations shown in FIG. 10A in accordance with one or more embodiments of the disclosure;

FIG. 10C illustrates an example of other metal layers on respective surfaces of the metal coated substrate shown in FIG. 10B in accordance with one or more embodiments of the disclosure; and FIG. 10D illustrates an example of the package substrate formed after subsequent treatment of the substrate shown in FIG. 10C in accordance with one or more embodiments of the disclosure.

DETAILED DESCRIPTION

Figure 1:
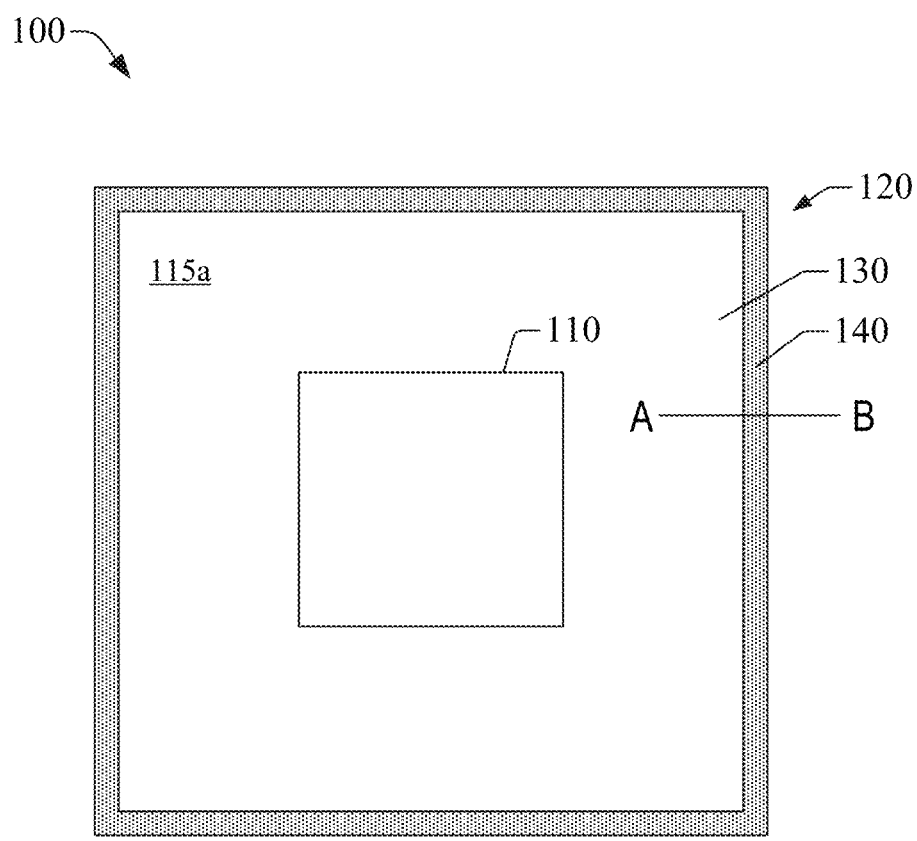
FIG. 1 illustrates a top view of a schematic example of a semiconductor package in accordance with one or more embodiments of the disclosure.

The disclosure recognizes and addresses, in at least certain aspects, the issue of warpage in semiconductor packages including a coreless or an ultra-thin core (UTC) package. Accordingly, in one aspect, the disclosure provides embodiments of semiconductor packages that mitigate package warpage, particularly in system-in-package (SiP) devices. To that end, in some embodiments, a package substrate can include a peripheral metal region having an assembly of rigid metal members, such as metal layers, metal interconnects, or a combination thereof. Metal interconnects can include, for example, trenches, vias, traces, metal pillars, plated through-holes (PTH), solder bumps, and the like. The metal region can be integrated into the package substrate during the manufacturing of the package substrate. In addition or in other embodiments, non-peripheral metal regions can be integrated into the semiconductor package in order to reduce specific patterns of mechanical deformations and/or to provide other functionality, such as electromagnetic interference (EMI) shielding. More specifically, in some embodiments, a package substrate can include a first layer and a second layer opposite to the first layer. The first layer and the second layer can each be planar or substantially planar (e.g., planar within the spatial resolution of commonplace planarization techniques) and can determine the thickness of the package substrate. In addition, the package substrate can include a first region bounded by the first layer and the second layer, where the first region can have a first surface in contact with the first layer and a second surface in contact with the second layer. The package substrate also can include a second region enclosing the first region and bounded by the first layer and the second layer. The second region can abut or otherwise be in contact with the first region and, thus, in one aspect, the second region can have substantially the same thickness as that of the first region. In addition, in some aspects, the second region can include one or more assemblies of metal members or structures. Specifically, in one example, the one or more assemblies can include a first assembly of metal layers and a second assembly of metal interconnects. Embodiments of the disclosure represent a key enabler for a segment of devices including client devices, mobile devices, and/or wearable devices. In such a segment, devices rely upon (or, in some scenarios, may even require) an ultra-low out-of-plane (or z-direction) height packaging solution and/or increased integration within a constrained or otherwise minimized form factor. Although reference is made to a peripheral metal region throughout this disclosure, the disclosure is not limited in that respect and other conductive rigid members can be included in or can constitute a peripheral conductive region for mitigation of package warpage. In addition, the disclosure is not limited with respect to the integration of a metal region (or other types of conductive regions) into the periphery of a package substrate. For instance, in embodiments including large package substrates, the disclosure contemplates the integration of the metal region in a non-peripheral portion of the package substrate in order to mitigate mechanical deformation. Although the integration of a non-peripheral metal region can reduce available real estate for the packaging of dies, interconnects, or other functional elements, the mitigation of substrate warpage may justify the loss of top-side real estate.

Embodiments of this disclosure can provide several advantages over conventional semiconductor packaging designs and implementations for warpage mitigation in package substrates. One example advantage includes preservation of top-side real estate within a package substrate. By avoiding external stiffening members, such as a top-side picture frame stiffener or a molding, embodiments of the disclosure not only can provide several cost efficiencies (e.g., financial cost, processing cost, time cost, etc.) but also can permit mounting or otherwise incorporating a greater number of components on the top-side of the package substrate. Another example advantage includes preservation of packaging footprint. By integrating a metal region into the substrate, the form factor along an in-plane direction (e.g., x direction and/or y direction) of the package substrate and/or along an out-of-plane direction (e.g., z direction) need not be increased. Yet another example advantage includes the preservation of conventional workflows (e.g., processing steps) and/or materials commonly utilized in the manufacturing of semiconductor packages.

With reference to the drawings, FIG. 1 illustrates a top view of a schematic example of a semiconductor package 100 in accordance with one or more embodiments of the disclosure. As illustrated, the semiconductor package 100 includes a semiconductor die 110 that can be surface mounted to a package substrate 120. The semiconductor package 100 also includes interconnects (not depicted) that can couple (mechanically and/or electrically) the package substrate 120 to a board substrate (not depicted). The board substrate is not included in the semiconductor package 100 and can be embodied in or can include a printed circuit board (PCB), a motherboard, or the like.

With respect to the semiconductor die 110, numerous types of interconnects (not depicted in FIG. 1) can permit surface mounting the semiconductor die 110 to a first surface 115a of the package substrate 120. To that end, in some aspects, such interconnects can mechanically and/or electrically couple the semiconductor die 110 to the package substrate 120 at conductive pads (e.g., metal pads or metallic pads) placed on a surface of the package substrate 120. In some embodiments, such interconnects can be embodied in or can include a ball grid array. The semiconductor die 110 can include circuitry that can provide, at least in part, one or more functionalities (e.g., computing, navigation, sensing, a combination thereof, or the like). More specifically, the circuitry can embody or can include microprocessors, microcontrollers, application specific integrated circuits (ASICs), gate arrays, memory devices, digital signal processors (DSPs), programmable logic devices (PLDs), graphics chipsets and/or PC chipsets, a combination of the foregoing, or the like. In some embodiments, the semiconductor die 110 also can include a microelectromechanical system (MEMS)—such as a movable diaphragm and a backplate in a microphone, a gyroscope or another type of solid-state accelerometer, and the like that also can permit or otherwise facilitate, at least in part, at least one of the one or more functionalities.

The package substrate 120 can be embodied in or can include a slab (not depicted) on which multiple semiconductor packages can be fabricated concurrently or nearly concurrently. As illustrated, in some embodiments, the slab can have a square cross-section having a side length in a range from about 5 mm to about 100 mm. The package substrate 120 includes an inner region 130 and an outer region 140 enclosing the inner region 130. The outer region 140 is integrated into the inner region 130, and thus, the outer region 140 is in contact with the inner region 130. In view of the layout of the outer region 140 relative to the inner region 130, the outer region 140 can be colloquially referred to as a metal moat. The width of the metal moat can be determined (e.g., optimized) based at least in part on product size, package size, layer count, and/or other design aspects (such as symmetry of the package substrate). In some embodiments, the width of the metal moat can be essentially uniform throughout the moat (e.g., the outer region 140) and can range from about 50 μm to about 2.0 mm (e.g., 50 μm, 500 μm, 1.0 mm, and 2.0 mm).

Although the package substrate 120 has essentially $C_4$ point-group symmetry, the disclosure is not so limited and other point-group symmetries can be implemented. In some embodiments, an outer region integrated into the package substrate 120 can partially enclose the inner region 130. In one of such embodiments, the outer region can form a U-shaped structure. In another one of such embodiments, the outer region can form an L-shaped structure. In addition or in other embodiments, the outer region can be replaced or supplemented by a confined conductive region integrated within the inner region 130. In one example, rather than relying on the outer region 140 to mitigate mechanical deformation of the package substrate 120, a fish-eye stripe region (not depicted in FIG. 1) can be integrated into the inner region 130.

Figure 2:
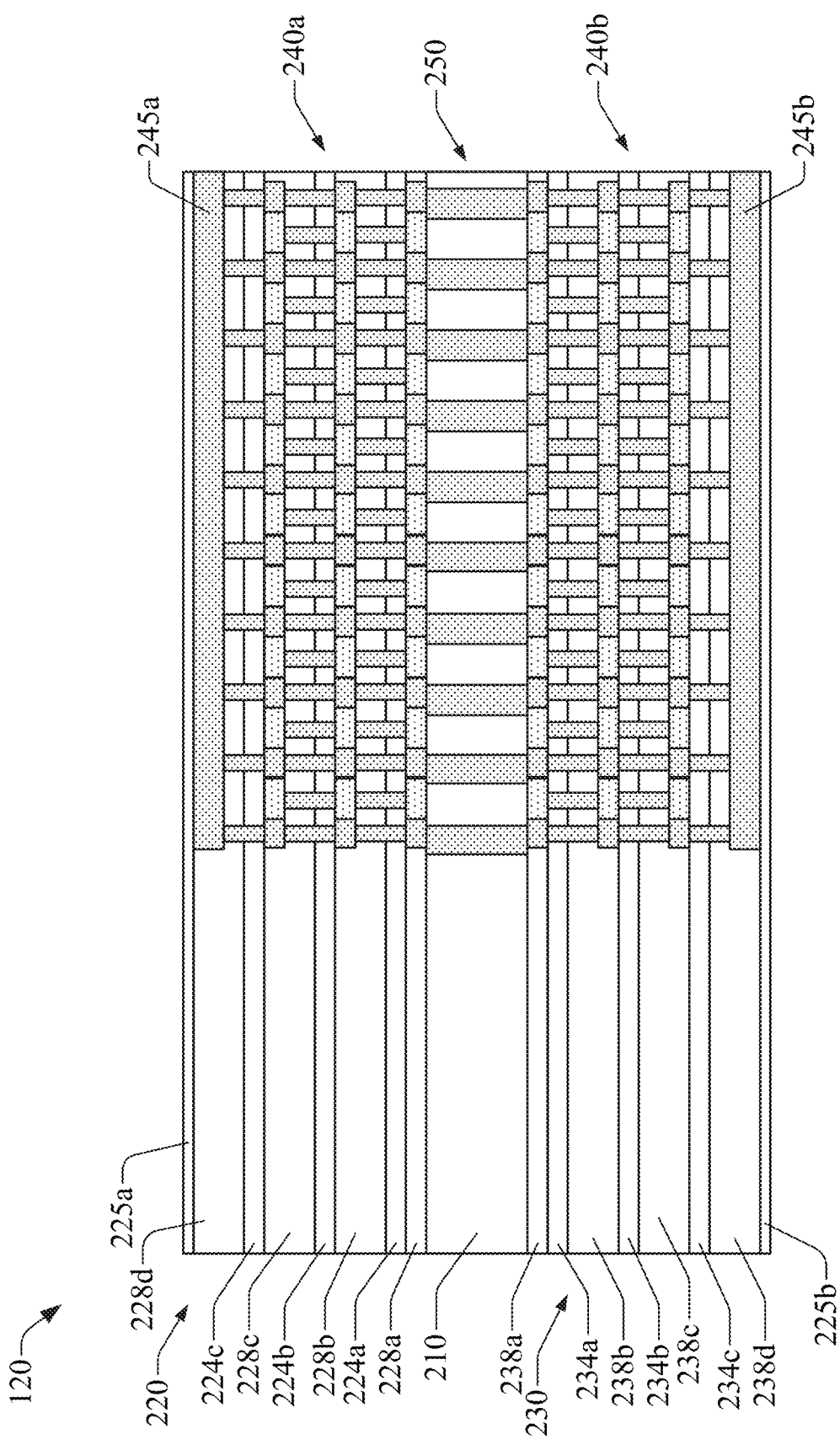
FIG. 2 illustrates a cross-sectional view of a portion of the example semiconductor package shown in FIG. 1, in accordance with one or more embodiments of the disclosure.

As mentioned, the package substrate 120 can include pads for wire bonding provided thereon or another type of interconnect attachment that requires an electrical contact. The package substrate 120 can be fabricated of any rigid or flexible solid material, such as a plastic; a ceramic; composite materials (e.g., metal-ceramic composites, metal-plastic composites, or the like); glass; epoxy laminates of fiberglass sheets; FR-4 materials; FR-5 materials; combinations thereof, or the like. In some embodiments, the inner region 130 can include a core and interconnect build-up layers on either side of the core. In other embodiments, the inner region 130 can include a coreless slab. The core and/or the interconnect build-up layers also can be formed from one or a combination of such materials. In some embodiments, such layers may not be fabricated from the same material as the material utilized to fabricate the core of the package substrate 120. FIG. 2 illustrates a cross-sectional view of an example embodiment of the package substrate 120 along the segment AB shown in FIG. 1. As illustrated in FIG. 2, the package substrate 120 is embodied in an ultra-thin core (UTC) substrate and, therefore, the inner region 130 can include a core layer 210, first interconnect layers 220, and second interconnect layers 230. The first interconnect layers 220 are disposed on a first side of the core layer 210, and are referred to as front interconnect layers. The second interconnect layers 230 are disposed on a second side of the core layer 210, and are referred to as bottom interconnect layers. As an example, the first interconnect layers include $N_F=8$ layers, including three metal layers 224a, 224b, and 224c; a solder resist (SR) layer 225a; and four dielectric layers 228a, 228b, 228c, and 228d. In addition, similarly, the second interconnect layers include $N_B=8$ layers, including three metal layers 234a, 234b, and 234c; a SR layer 225b; and four dielectric layers 238a, 238b, 238c, and 238d. Although eight layers are illustrated, the disclosure is not so limited and any number of layers ranging from 2 through 12 (e.g., 2, 3, 4, 5, 6, 7, 8, 9, 10, 11, and 12) can be utilized. In addition, in some embodiments, $N_B$ can be different from $N_F$.

With further reference to FIG. 1, in some aspects, the outer region 140 can include metal members (e.g., Cu members) and/or other types of conductive materials assembled in numerous structures. In one example, the outer region 140 can include one or more assemblies of the metal members, including at least one interlocking metal assembly. The metal members can include, for example, via(s), plated through-hole(s), trace(s), a combination thereof, or the like, and can be formed from a rigid material, such as a solid metal (copper, aluminum, tungsten, silver, gold, palladium, platinum, zinc, nickel, or an alloy of two or more of the foregoing metals, or the like). Each (or, in some embodiments, at least one) of the one or more assemblies of the metal members can be formed during substrate fabrication process (including standard processing stages and/or techniques), without incorporation of new processes and/or other processes beyond those commonly utilized in the processing of a package substrate.

As mentioned, while utilizing a metal can permit straightforward integration into existing processes for formation of the semiconductor package 100, the disclosure is not limited in that respect and the interlocking structure can be formed from non-metal materials (e.g., III-V semiconductors, II-VI semiconductors, high-k dielectrics, and the like). In some embodiments, a combination of a metal and a semiconductor can be utilized to form the interlocking structure.

In some embodiments, the one or more assemblies of metal members included in the outer region 140 can be embodied in or can include an interlocking metal assembly. FIG. 2 illustrates an example of an interlocking metal structure. Specifically, FIG. 2 illustrates an example of the metal assemblies that can be included in the outer region 140. A first assembly of metal members 240a can be formed on a first side of the core layer 210, where the first assembly includes a first interlocking metal structure including metal pillars, each mechanically coupled, at a first end, to a metal trench and coupled, at a second end, to another metal trench. In one aspect, the metal pillars and metal trenches coupled thereto can be arranged in a compact lattice, such as a face centered lattice (fcc) or a hexagonal lattice in order to increase the amount, and thus, volume, of the metal forming the interlocking structure. Such arrangements can permit increasing the stiffness of the outer region 140, thus increasing the stiffness of the package substrate 120. Similarly, a second assembly of metal members 240b can be formed on a second side of the core layer 210, where the second assembly also includes another interlocking metal assembly. In addition, to provide support and increase stiffness, laser through-hole (LTH) vias 250 can be formed in the core layer 210. As further illustrated, in some scenarios, a first metal layer 245a and a second metal layer 245b can be formed adjacent (e.g., abutting) the SR layer 225a and SR layer 225b, respectively. It is noted that while the interlocking metal structure illustrated in FIG. 2 span nearly the entirety of the thickness of the package substrate 120, the disclosure is not so limited and the interlocking structure can be thinner than the package substrate 120.

Figure 3:
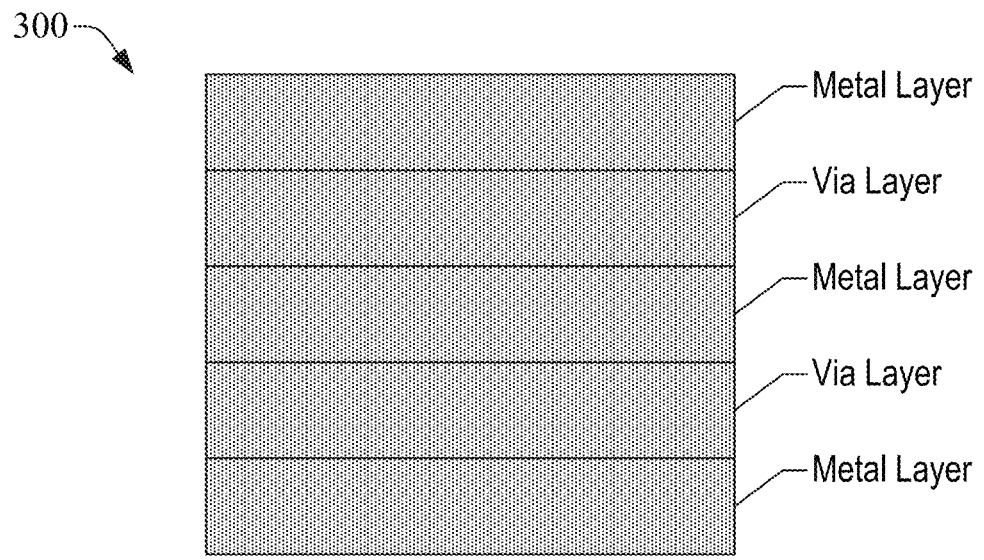
FIGS. 3-4 illustrate cross-sectional views of schematic examples of portions of semiconductor packages in accordance with one or more embodiments of the disclosure.
Figure 4:
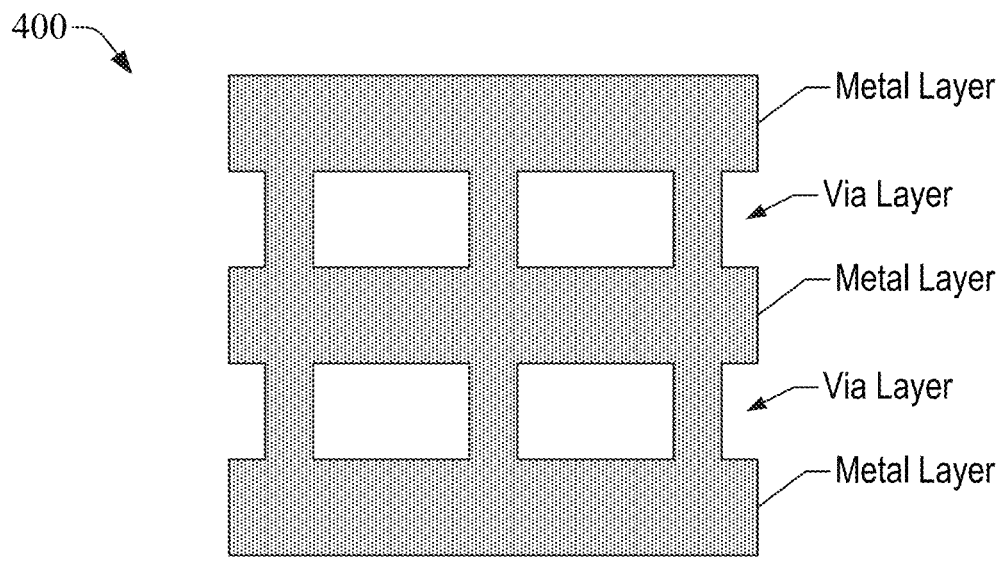

Another embodiment includes a metal moat having a nearly continuous copper wall in the non-core via layers, as is shown in FIG. 3, instead of cylindrical vias, as is shown in FIG. 4. The continuous-wall approach can be implemented by defining the vias lithographically instead of using laser ablation processes, which processes are typically limited to creating substantially cylindrical vias. In some aspects, the lithographic approach can permit producing most any shape of vias (e.g., trench, picture frame, and the like), which vias provide higher stiffness than the interlocking cylindrical structures illustrated in FIG. 2 or FIG. 4.

Figure 5:
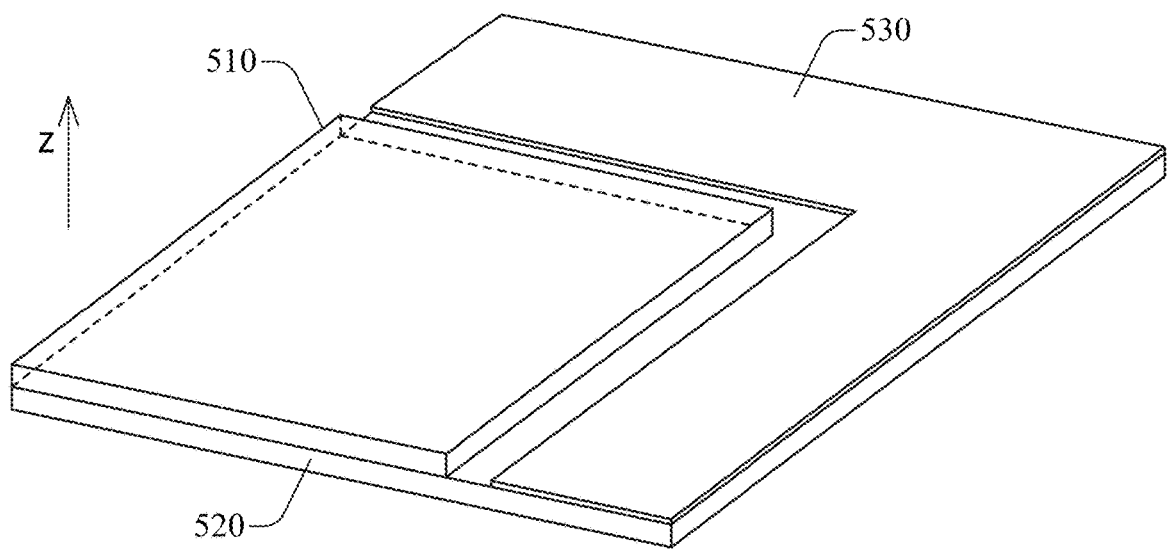
FIGS. 5-6 illustrate perspective views of models of example semiconductor packages in accordance with one or more embodiments of the disclosure.
Figure 6:
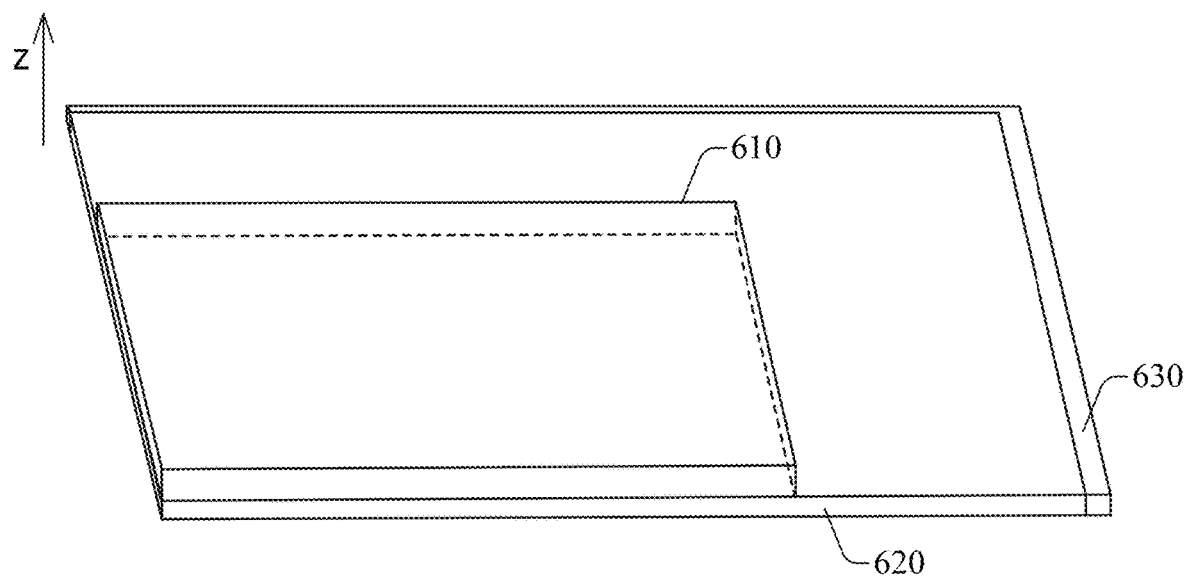

In order to compare warpage in a conventional package substrate incorporating a top mounted stiffener to warpage in a package substrate in accordance with embodiments of this disclosure, a simulation of warpage in a semiconductor package including a package substrate having integrated therein a peripheral metal moat with trench interconnects (e.g., trench vias) similar to those discussed herein (see, e.g., FIG. 3) was performed. In some aspects, the simulation used finite element analysis and modeled the different elements of the semiconductor package (e.g., a semiconductor die, a substrate, a top-side stiffener, and/or an integrated metal moat) as continuous layers, each having respective defined sizes and respective mechanical properties (such as Young's modulus) corresponding to their respective constituent materials. In order to assess warpage, the maximum difference in displacement in the z direction (see, e.g., FIG. 5) between two points on the deformed package after cooling down from the processing temperature (e.g., a temperature of about a few hundred degrees Celsius) to about room temperature was used. Specifically, three embodiments were simulated, each embodiment having a 15 mm×15 mm×400 µm package substrate and a 10 mm×10 mm×300 µm die. A first embodiment (referred to as Package I) includes the package substrate and the die, without a stiffener. A second embodiment (referred to as Package II) includes the package substrate, the die, and a Cu picture frame stiffener having a hollow square cross-section, having major sides of 2 mm each, and a thickness of 50 µm. The stiffener is top mounted on the package substrate. A third embodiment (referred to as Package III) includes the package substrate, the die, and a peripheral Cu moat having a width of 200 µm and, in accordance with aspects of the disclosure, the same thickness as the package substrate. Without intending to be bound by theory and/or simulation details, the symmetry of the simulated semiconductor packages can be utilized or otherwise leveraged in order to reduce model size and computational demand of the simulations. As such, quarter models can be utilized in the simulations. As an illustration, FIGS. 5 and 6 present perspective views of respective quarter models of the simulated second and third embodiments, respectively. Specifically, FIG. 5 illustrates a quarter model of Package II, including a portion of a semiconductor die 510, a portion of a package substrate 520, and a portion of a Cu picture frame stiffener 530. In addition, FIG. 6 illustrates a quarter model of Package III, including a portion of the semiconductor die 610, a portion of the package substrate 620, and a portion of a peripheral Cu moat 630.

For the geometric parameters of the simulated embodiments, the simulations convey that the decrease in package substrate warpage for Package II and Package III with respect to Package I is about the same. In accordance with aspects of the disclosure, the thickness of the Cu moat in Package III increases with the thickness of the substrate package, whereas the thickness of the top mounted stiffener in Package II remains the same. Therefore, without intending to be bound by theory and/or modeling, for thicker package substrates (e.g., t greater than 400 µm), Package III can provide greater warpage reduction than Package II.

Figure 7:
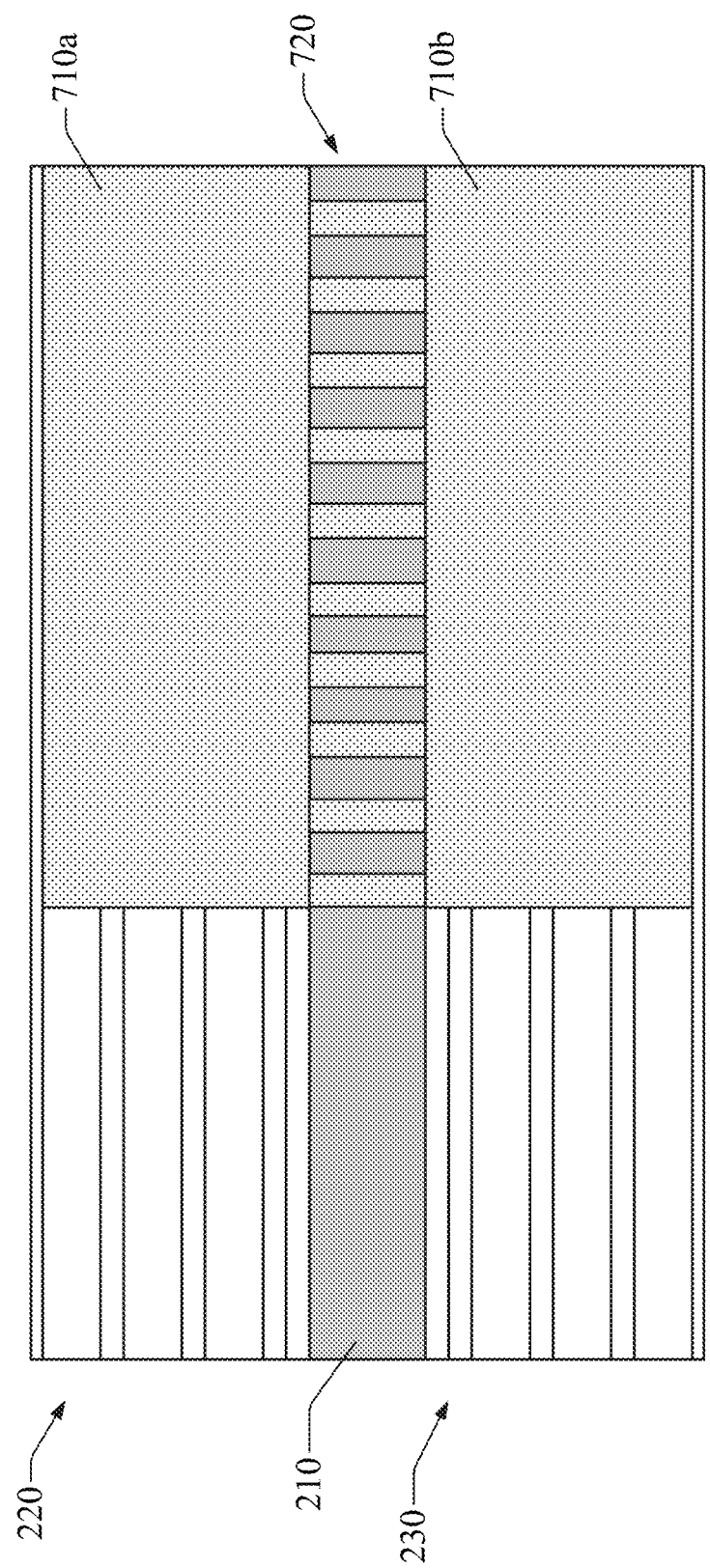
FIG. 7 illustrates a cross-sectional view of a portion of an example semiconductor package in accordance with one or more embodiments of the disclosure.

As mentioned, lithographically defined metal members in the via layers can permit the generation of trench like members rather than cylindrical or otherwise round vias. Therefore, in one aspect, such members can permit the formation of a solid cross-section spanning the entirety or essentially the entirety of a peripheral region (e.g., the outer region 140) integrated into a package substrate (e.g., the package substrate 120) except in a core region of the package substrate, as is illustrated in FIG. 7. Specifically, a first metal slab 710a can be integrated into a region on a first side of the core layer 210, and a second slab 710b can be integrated into another region on a second side of the core layer 210. Similar to the interlocking metal structure illustrated in FIG. 2, LTH vias 720 can be formed in the core layer 210.

Figure 8:
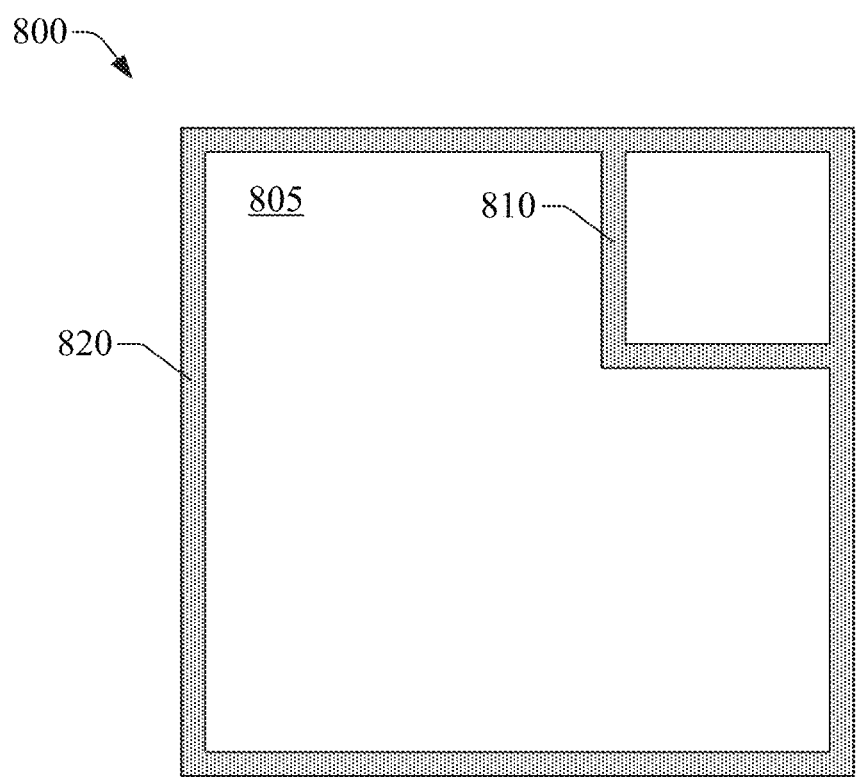
FIG. 8 illustrates a top view of a schematic semiconductor package in accordance with one or more embodiments of the disclosure.

As mentioned, other configurations of a confined conductive region can be integrated into a semiconductor package in order to achieve other efficiencies besides mitigation of mechanical deformation of coreless package substrates and/or UTC package substrates. More specifically, FIG. 8 illustrates a top view of a schematic semiconductor package 800 in accordance with one or more embodiments of the disclosure. As illustrated, a confined metal region 810 can be utilized or otherwise leveraged as a grounding frame for electromagnetic interference (EMI) shielding. In scenarios in which a compartmental shield can be desired or otherwise necessary, the confined metal region 810 can be additional to an outer region 820 and can be integrated within the interior of a package substrate 805. Lithographically defined assemblies of metal members (e.g., trenches, vias, and/or PTHs) can permit forming interior confined metal regions of numerous geometries.

Figure 9A:
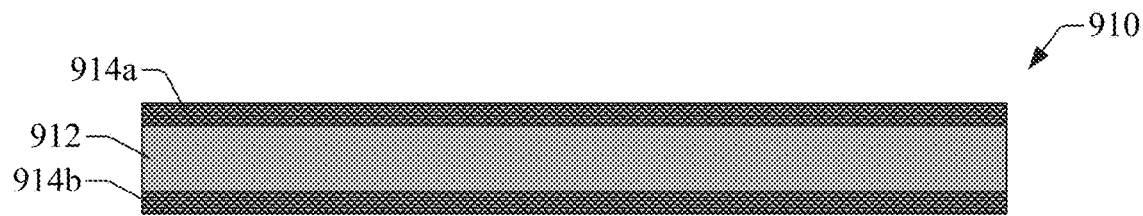
FIGS. 9A-9I illustrate schematic cross-sectional views representative of stages of an example process for forming a package substrate in accordance with one or more embodiments of the disclosure. Specifically.

FIGS. 9A-9I illustrate schematic cross-sectional views representative of stages of an example process for forming package substrates in accordance with one or more embodiments of the disclosure. Specifically, FIG. 9A illustrates an example of a core substrate 910 in accordance with one or more embodiments of the disclosure. The core substrate 910 can include a core layer 912 (e.g., a dielectric layer) having a top planar surface and a bottom planar surface opposite to top planar surface. The core substrate 910 extends longitudinally along a stacking direction, and also includes a metal layer 914a and a metal layer 914b. The metal layer 914a and the metal layer 914b are abutting or otherwise in contact with, respectively, the top planar surface and the bottom planar surface of the core layer 912. The metal layer 914a can be embodied in or can include a Cu layer, a Ni layer, a W layer, or the like. Similarly, the metal layer 914b can be embodied in or can include a Cu layer, a Ni layer, a W layer, or the like. In some implementations, the core substrate 910 can be embodied in a UTC and, thus, in some aspects, the thickness of the core layer 912 along the stacking direction can be essentially uniform and can have a magnitude in a range from about 10 µm to about 30 µm.

Figure 9B:
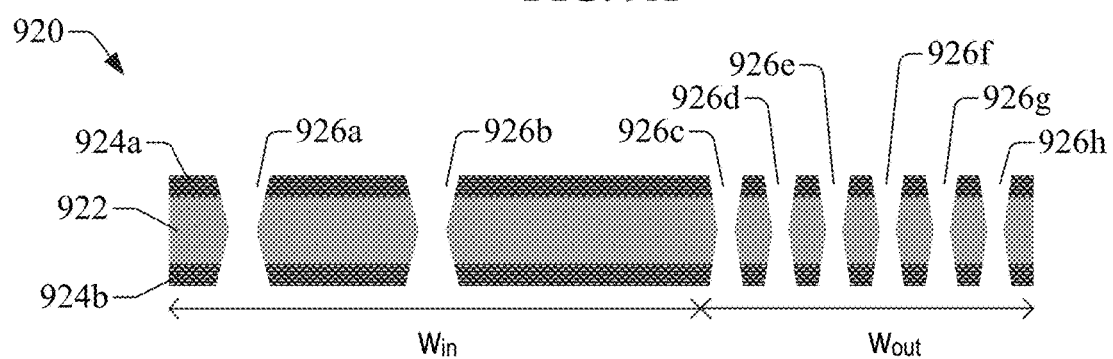

The core substrate 910 can be treated to form perforations in the core substrate 910, resulting in perforated core substrate 920 as illustrated in FIG. 9B. The treatment can include laser ablation of the core substrate 910 to form through holes 926a, 926b, 926c, 926d, 926e, 926f, 926g, and 926h. The formation of such holes results in a perforated metal layer 924a and a perforated metal layer 924b. Thus, the holes can be referred to as laser through holes (LTHs). As illustrated, the holes 926a, 926b, 926c, 926d, 926e, 926f, 926g, and 926h. and can be distributed non-uniformly in the perforated core substrate 920. Specifically, in one example, hole 926a and hole 926b can be formed in an inner region of the perforated core substrate 920, and holes 926c-926h can be formed in an outer region of the perforated core substrate 920. The outer region can have a width $w_{out}$, extending from an edge surface of the core substrate 910 to the interior of the core substrate 910 along a direction transversal to the stacking direction.

Figure 9C:
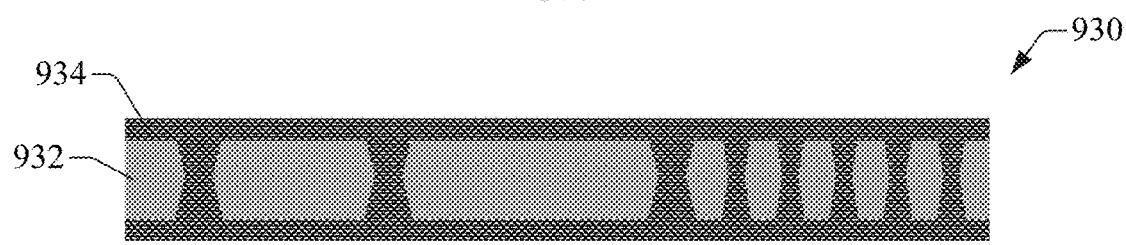

The perforated core substrate 920 can be treated to fill the holes 926a, 926b, 926c, 926d, 926e, 926f, 926g, and 926h, forming a metal coated substrate 930 as is shown in FIG. 9C. To that end, an amount of a metal—e.g., a base/simple metal, a noble metal, an alloy of two or more metals, or the like—can be deposited on the perforated core substrate 920. Coverage of the perforated core substrate 920 with the amount of the metal can be accomplished by one or a combination of numerous metal deposition processes, including, for example, chemical vapor deposition (CVD); atomic layer deposition (ALD); physical vapor deposition (PVD); sputtering; chemical solution deposition; plating (autocatalytic plating, immersion plating, electrolytic plating, or a combination thereof); or the like. Chemical vapor deposition can include, for example, metal organic chemical vapor deposition (MOCVD), low-pressure chemical vapor deposition (LPCVD), or plasma enhanced chemical vapor deposition (PECVD). Therefore, in some embodiments, filling the holes 926a, 926b, 926c, 926d, 926e, 926f, 926g, and 926h can include depositing the amount of the metal (e.g., Cu, Ni, W, or the like) by plating the perforated core substrate 920. In an implementation in which the plating is performed via electroless plating (or autocatalytic plating), a second portion of the metal wire 616 that is not plated can be utilized to control the immersion of the ceramic core 612 and the portion of the metal wire 616 that is plated into an electroless bath contained in a vat, the bath including an aqueous solution of metal ions (e.g., Cu ions), reducing agents and other agents, and bath stabilizers.

As illustrated, the metal coated substrate 930 can include a metal structure 934 interlocked with the perforated core layer 932. The higher density of holes in the outer region results in a higher density of metal pillars intercalated with the insulator material of the perforated core layer 922.

Figure 9D:
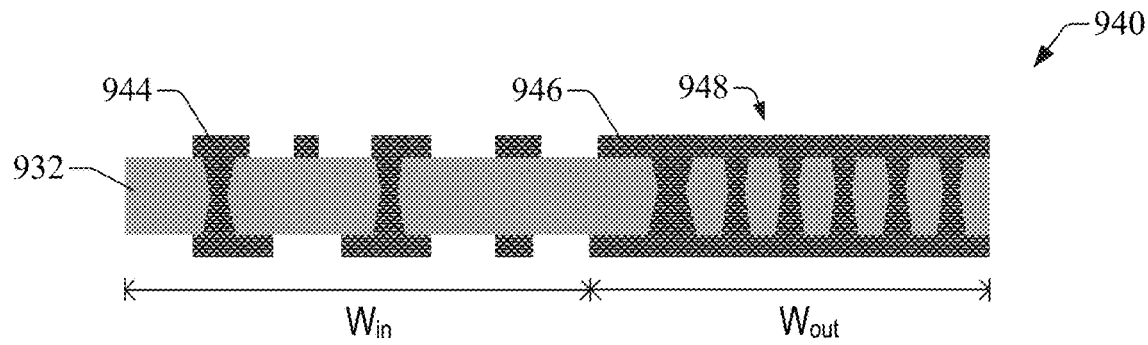

The metal coated substrate 930 can be treated to remove portions of the metal from the metal structure 934. To that end, in some implementations, the metal coated substrate 930 can be lithographically patterned by depositing mask material (e.g., a dielectric material) that defines areas for removal of metal, and subsequently etched via selective metal etching during a defined period, for example. In some embodiments, the selective metal etching can include wet etching, where the patterned substrate can be immersed, during the defined period, into a vat containing an etching solution that can selectively remove the metal (e.g., Cu, Ni, W, Ag, Au, Pt, or the like). The etching solution can include, for example, ferric chloride or another metallurgic etching solution. In other embodiments, dry etching (e.g., plasma etching, deep reactive-ion etching, or the like) can be utilized for selective metal removal. Further, remaining mask material can be stripped off. As illustrated in FIG. 9D, removing the portions of the metal can result in a first metal structure 944 and a second metal structure 946. The first metal structure 944 can be mechanically coupled with an inner portion of the perforated core layer 932, and can include a top routing layer (or front layer) on a top surface of the perforated core layer 932 and a bottom routing layer (or back layer) on a bottom surface of the perforated core layer 932. The top routing layer and the bottom routing layer include respective groups of metal pads. In one aspect, the second metal structure 946 is a precursor metal structure 948 of a stiffener metal structure integrated into the package substrate being formed according to the example process described herein. As such, a top layer and a bottom layer of the second metal structure do not include intentionally formed recesses or other types of openings. As illustrated, the precursor metal structure 948 can have a width $W_{out}$, extending from an edge surface of the perforated core layer 932 to the interior of the perforated core layer 932 along a direction transversal to the stacking direction. As mentioned, in some examples, $W_{out}$ can essentially uniform along a direction perpendicular to the stacking direction and can range from about 50 μm to about 2.0 mm (e.g., 50 μm, 500 μm, 1.0 mm, and 2.0 mm).

Figure 9E:
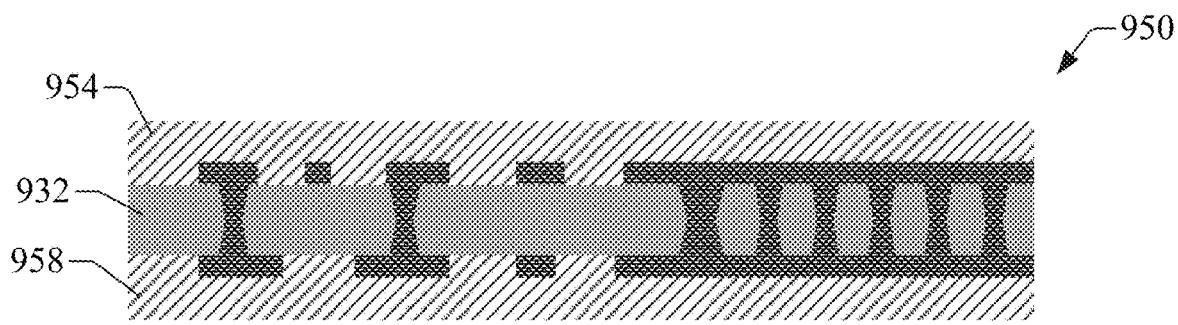

The example process to form a package substrate in accordance with this disclosure can continue with the coating of the substrate 940, resulting in the formation of build-up layers on the substrate 940 as is shown in FIG. 9D. More specifically, in some aspects, the top portion and the bottom portion of the substrate 940 can be covered with an amount of dielectric material (e.g., an Ajinomoto build-up film (ABF) or other types of epoxy resin; fiberglass sheets; FR-4 materials; FR-5 materials; or the like), resulting in a dielectric coated substrate 950 as is shown in FIG. 9E. The dielectric coated substrate 950 includes a dielectric build-up layer 954 and a dielectric build-up layer 958.

Figure 9F:
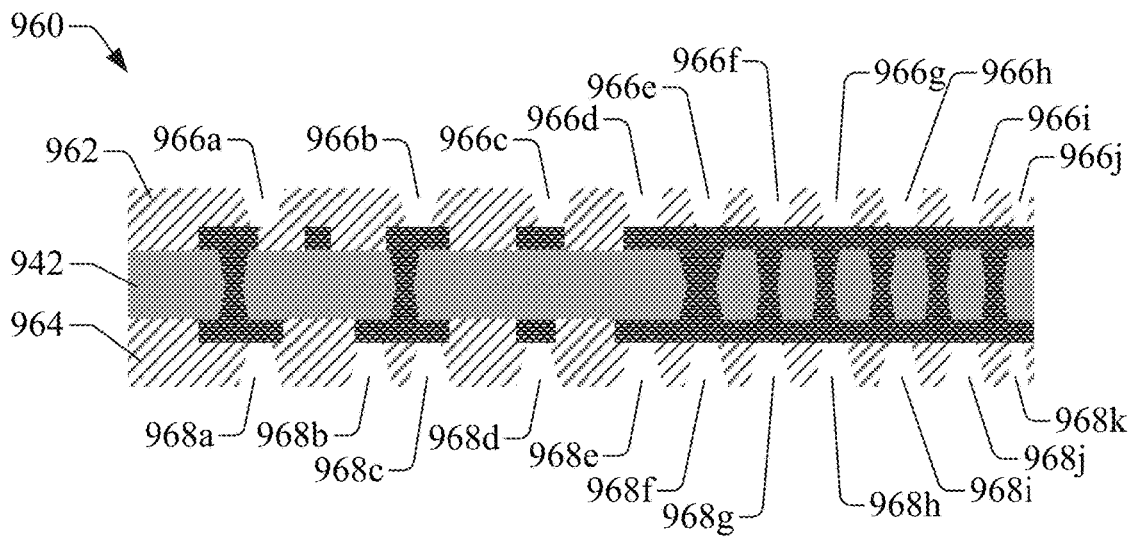

The dielectric coated substrate 950 can be treated to form perforations on each of the dielectric build-up layer 954 and the dielectric build-up layer 958, resulting in a perforated core substrate 960 having a perforated build-up layer 962 and a perforated build-up layer 964, as is shown in FIG. 9F. The perforations can be formed, for example, via laser ablation and, thus, the perforations can be referred to as laser blind holes in that the perforations do not pierce through the dielectric coated substrate 950. In some aspects, perforations in the perforated build-up layer 962 can include a first group of holes including hole 966a, hole 966b, and hole 966c, and a second group of holes including hole 966d, hole 966e, hole 966f, hole 966g, hole 966h, hole 966i, and hole 966j. The first group of holes can be positioned in an inner region of the dielectric coated substrate 950, and the second group of holes can be positioned on an outer region of the dielectric coated substrate 950. In one aspect, the first group of holes can be arranged or otherwise configured according to routing criteria or constraints, and the size of each of the first group of holes also can be determined based on the same or other routing criteria or constraints. In another aspect, the second group of holes can be arranged according to a desired or otherwise intended design directed to increase the amount of metal in the outer region, with the ensuing increase in the overall stiffness of the package substrate being formed. Such a design can determine, in yet another aspect, the respective size and/or shape of each of the second group of holes. As mentioned, in one example, in a plane normal to the stacking direction, the second group of holes can be arranged in a compact lattice (such as an fcc or a hexagonal lattice) in order to increase the amount of metal that can be deposited collectively in the second group of holes. In some embodiments, each of the second group of holes can have substantially cylindrical symmetry along an axis essentially parallel to the stacking direction. In other embodiments, the second group of holes can include one or more trenches distributed or otherwise placed on a plane of the perforated build-up layer 962.

Similarly, in some aspects, perforations in the perforated build-up layer 964 can include (1) a first group of holes including hole 968a, hole 968b, hole 968c, and 968d, and (2) a second group of holes including hole 968e, hole 968f, hole 968g, hole 968h, hole 968i, hole 968j, and hole 968k. The first group of holes can be positioned in an inner region of the dielectric coated substrate 950, and the second group of holes can be positioned on an outer region of the dielectric coated substrate 950. In one aspect, the first group of holes can be arranged or otherwise configured according to the routing criteria or constraints, and the size of each of the first group of holes also can be determined based on the same or other routing criteria or constraints. In another aspect, the second group of holes can be arranged according to a desired or otherwise intended design directed to increase the amount of metal in the outer region, with the ensuing increase in the overall stiffness of the package substrate being formed. As mentioned, such a design can determine, in yet another aspect, the respective size and/or shape of each of the second group of holes. In some embodiments, each of the second group of holes can have substantially cylindrical symmetry along an axis essentially parallel to the stacking direction. In other embodiments, the second group of holes can include one or more trenches distributed or otherwise placed on a plane of the perforated build-up layer 962.

Figure 9G:
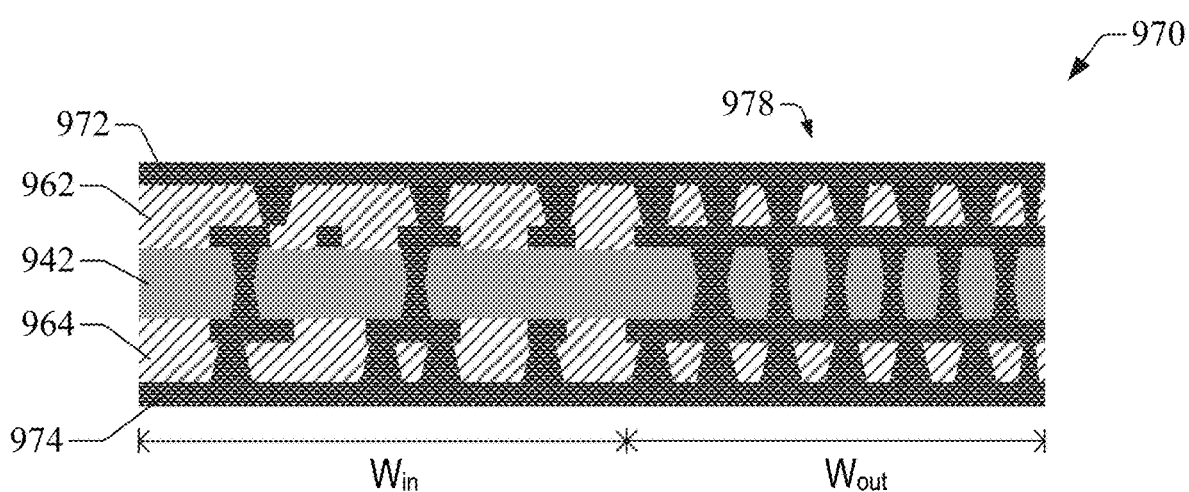

The perforated core substrate 960 can be covered or otherwise coated with an amount of metal to fill the perforations, resulting in the metal coated substrate 970 shown in FIG. 9G. As described herein, numerous metals or metallic materials can be utilized, including Cu, Ni, W, Ag, Au, Pt, a combination thereof, or the like. Further, as mentioned, numerous deposition processes can be utilized to deposit the amount of the metal (or, in some embodiments, metallic material), including any one or a combination of CVD, ALD, PVD, sputtering, chemical solution deposition, plating, or the like. As such, in some embodiments, filling the first group of holes in the perforated build-up layer 962 and the second group of holes in the perforated dielectric layer 964 can include depositing the amount of the metal (e.g., Cu, Ni, W, or the like) by plating the perforated core substrate 960. In an implementation in which the plating is performed via electroless plating (or autocatalytic plating), the perforated core substrate 960 can be immersed into an electroless bath contained in a vat, the bath including an aqueous solution of metal ions (e.g., Cu ions), reducing agents and other agents, and bath stabilizers. As illustrated, the metal coated substrate 970 includes a metal layer 972 and a metal layer 974. In one aspect, formation of such metal layers can result in a metal structure 978 at the outer region of the metal coated substrate 970. The metal structure 978 is larger than the precursor metal structure 948, and the metal structure 978 also is intercalated with dielectric materials, e.g., the dielectric material of the core layer 912 and the dielectric material of the perforated build-up layer 962.

Figure 9H:
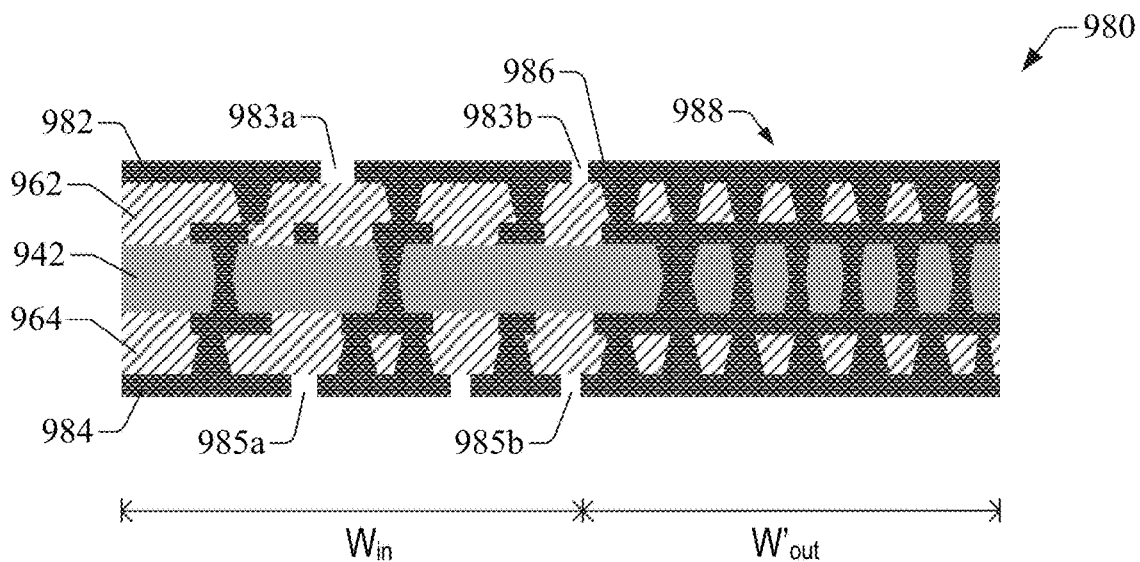

The metal coated substrate 970 can be treated to remove portions of the metal (e.g., Cu, Ni, W, Ag, Au, Pt, or the like) from the metal layer 972 and the metal layer 974. To that end, in some implementations, the metal coated substrate 970 can be lithographically patterned by depositing mask material (e.g., a dielectric material) that defines areas for removal of metal, and subsequently etched via selective metal etching during a defined period, for example. In some embodiments, the selective metal etching can include wet etching, where the patterned substrate can be immersed, during the defined period, into a vat containing an etching solution that can selectively remove the metal (e.g., Cu, Ni, W, Ag, Au, Pt, or the like). As mentioned, the etching solution can include, for example, ferric chloride or another metallurgic etching solution. In other embodiments, dry etching can be utilized for selective metal removal. Further, remaining mask material can be stripped off. As illustrated in FIG. 9H, removing the portions of the metal can result in a first metal layer 982 and a second layer structure 984. The first metal layer 982 can embody or can include another top routing layer (or front layer) on a top surface of the perforated build-up layer 962. The second metal layer 984 can embody or can include another bottom routing layer (or back layer) on a bottom surface of the perforated build-up layer 964. Such a top routing layer and bottom routing layer include respective groups of metal pads resulting from the selective metal etching. In addition, in one example, the first metal layer 982 can define a plurality of openings, including an opening 983*a* and an opening 983*b*, and the second metal layer 984 can include another plurality of openings, including an opening 985*a* and an opening 985*b*. A spatial arrangement of the openings in the first metal layer 982 and a second spatial arrangement of the openings in the second metal layer 984 can be determined by a specific routing design of the metal coated substrate 980.

The selective metal removal also can yield a metal structure 986 which constitutes a stiffener metal structure 988 integrated into the package substrate being formed according to the example process described herein. As such, a top layer and a bottom layer of the metal structure 986 do not include intentionally formed recesses or other types of openings. As illustrated, the stiffener metal structure 988 includes the metal structure 986 intercalated with dielectric materials. In accordance with aspects of this disclosure, the stiffener metal structure 988 can have a width $W'_{out}$, extending from an edge surface of the metal coated substrate 970 to the interior of the metal coated substrate 970 along a direction transversal to the stacking direction.

Figure 9I:
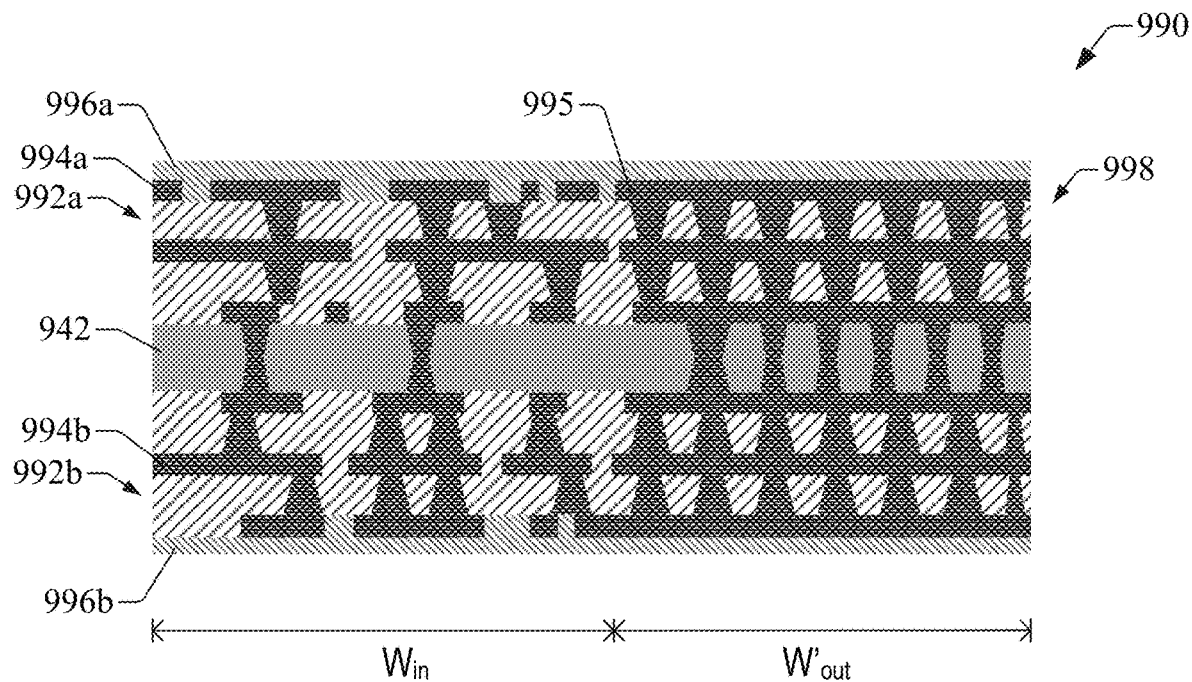

The example process can continue with additional treatments of the metal coated substrate 980, the treatments resulting in the package substrate 990 shown in FIG. 9I. Thus, in one example, the metal coated substrate 980 can be covered with an amount of a dielectric material (e.g., ABF or other types of epoxy resin; fiberglass sheets; FR-4 materials; FR-5 materials; or the like), resulting in a top build-up layer and a bottom build-up layer, each of which layers can be treated to form perforations therein, resulting in perforated build-up layers. As described herein, first perforations in the top build-up layer can have a different arrangement from that of second perforations in the bottom build-up layer. In addition, the first perforations can include a first group of holes within the inner region of the metal coated substrate 980 and a second group of holes within the outer region of the metal coated substrate 980. Perforations in the top build-up layer and the bottom build-up layer can be covered with respective amounts of metals. To that end, for example, numerous deposition processes can be utilized, including any one or a combination of CVD, ALD, PVD, sputtering, chemical solution deposition, plating, or the like. Coverage of the perforations can yield a build-up layer 992*a* and a build-up layer 992*b*.

Further, coverage of the perforations also can yield a top metal layer and a bottom metal layer, both of which layers can be treated to form a top routing layer 994*a* and a bottom routing layer 994*b*. As discussed, such a treatment can permit adding top and bottom metal layers to the metal structure 986, resulting in the metal structure 995. As such, in some implementations, the top metal layer and the bottom metal layer can be lithographically patterned in order to define areas for metal removal (and formation of metal pads for routing) and to preserve the portions of metal coating the metal structure 986. Subsequently, etching can be implemented to remove the metal according to the lithographic pattern, and the remaining mask material can be stripped off in a dry film process. The formation of the metal structure 995 results, in one aspect, in the stiffener metal structure 998, which includes an arrangement of metal layers and vias (or metal pillars) intercalated with dielectric materials. As mentioned, the stiffener metal structure 998 can be referred to as a metal moat structure.

The example process also can include covering the metal layer 994*a*, the metal layer 994*b*, and the metal structure 995 with solder resist in order to finish the formation of a package substrate 990 as is shown in FIG. 9I. The coating of such layers and structure with solder resist (SR) can be referred to as SR lamination and can be implemented via a paste deposition process or a dry film process. SR lamination yields a top SR layer 996*a* and a bottom SR layer 996*b*.

More generally, further treatments including at least some of those described in connection with FIGS. 9B-9H can be performed to the metal coated substrate 980 and resulting substrates therefrom until a satisfactory or otherwise desired package substrate other than the package substrate 990 has been formed. A satisfactory package substrate can be similar in structure to the package substrate 990, including a defined number of metal layers (front routing layers, back routing layers, and stiffener layers) and a defined number of build-up layers. Such treatments can proceed until one or more completion criteria are satisfied.

As described herein, in some embodiments, rather than relying on laser ablation for the formation of perforations on a dielectric coated substrate, lithography can be utilized or otherwise leveraged in order to form vias in an inner region of the dielectric coated substrate and trenches or other types of extended recessed areas in an outer region of the dielectric coated substrate. To that end, in some aspects, mask material can be deposited and developed in order to define areas for removal of dielectric material, and the dielectric material can be subsequently etched during a defined period, for example. Lithographically defined openings can permit forming an integrated stiffener region with a greater amount of metal compared to other stiffener regions that rely on essentially cylindrical vias. FIGS. 10A-10D illustrate schematic cross-sectional views representative of stages of another example process for forming a package substrate in accordance with one or more embodiments of the disclosure.

Figure 10A:
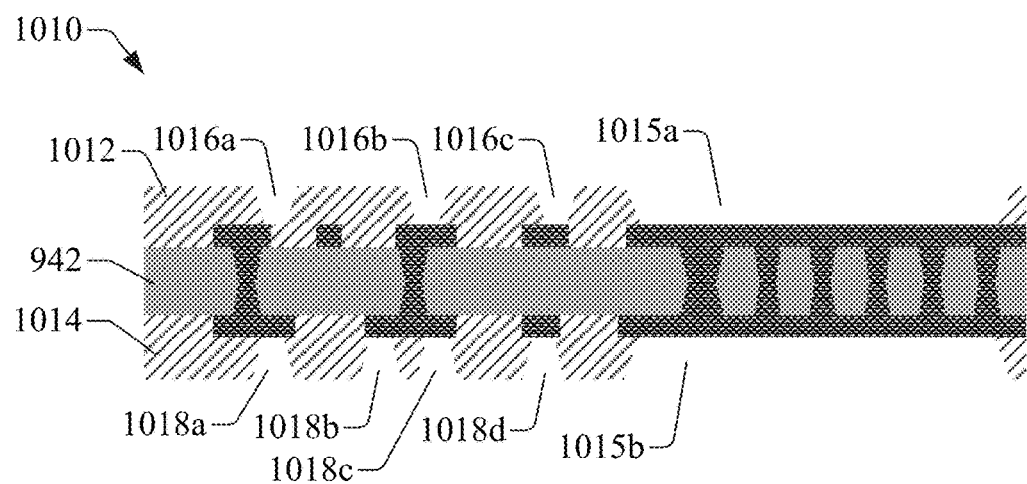
FIGS. 10A-10D illustrate schematic cross-sectional views representative of stages of another example process for forming a package substrate in accordance with one or more embodiments of the disclosure. Specifically.

More specifically, the dielectric coated substrate 950 can be treated to form perforations on each of the dielectric build-up layer 954 and the dielectric build-up layer 958, resulting in a perforated core substrate 1010 as is shown in FIG. 10A. The perforations can be formed, for example, by lithographically patterning a top surface of the dielectric build-up layer 954 and a bottom surface of the dielectric build-up layer 958. In one aspect, the lithographic patterning can include first perforations in an inner region of the dielectric coated substrate 950 and one or more trenches in an outer region of the dielectric coated substrate 950. As illustrated, in some aspects, the first perforations in the perforated build-up layer 1012 can include a first group of holes including hole 1016a, hole 1016b, and hole 1016c. The one or more trenches can include a trench 1015a. In one aspect, the first group of holes can be arranged or otherwise configured according to routing criteria or constraints, and the size of each of the first group of holes also can be determined based on the same or other routing criteria or constraints. In another aspect, the one or more trenches can be arranged in order to attain a satisfactory coverage (e.g., maximize) of metal on the precursor metal structure 948 shown in FIG. 9D, with the ensuing increase in the overall stiffness of the package substrate being formed.

Similarly, in some aspects, perforations in the perforated build-up layer 1014 can include (1) a first group of holes including hole 1018a, hole 1018b, hole 1018c, and hole 1018d, and (2) one or more trenches including a trench 1015b. The first group of holes can be positioned in an inner region of the dielectric coated substrate 950, and the one or more trenches can be positioned in an outer region of the dielectric coated substrate 950. In one aspect, the first group of holes can be arranged or otherwise configured according to the routing criteria or constraints, and the size of each of the first group of holes also can be determined based on the same or other routing criteria or constraints. In another aspect, the one or more trenches can be arranged in order to attain a satisfactory coverage (e.g., maximize) of metal on the precursor metal structure 948 shown in FIG. 9D, with the ensuing increase in the overall stiffness of the package substrate being formed.

Figure 10B:
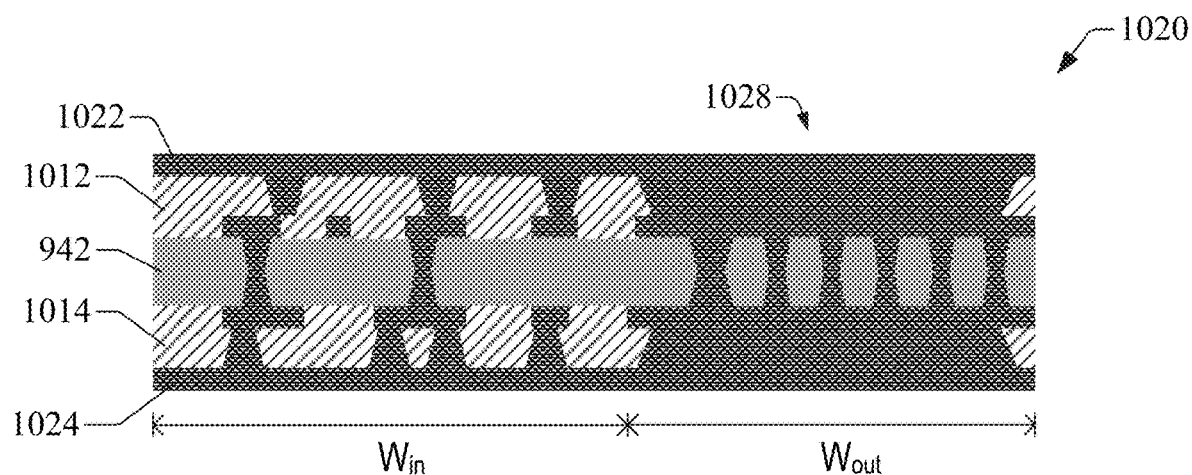

The perforated substrate 1010 can be covered or otherwise coated with an amount of metal to fill the perforations, resulting in the metal coated substrate 1020 shown in FIG. 10B. As described herein, numerous metals or metallic materials can be utilized, including Cu, Ni, W, Ag, Au, Pt, a combination thereof, or the like. Further, as mentioned, numerous deposition processes can be utilized to deposit the amount of the metal (or, in some embodiments, metallic material), including any one or a combination of CVD, ALD, PVD, sputtering, chemical solution deposition, plating, or the like. As such, in some embodiments, filling the first group of holes in the perforated build-up layer 1012 and the one or more trenches in the perforated build-up layer 1014 can include depositing the amount of the metal (e.g., Cu, Ni, W, or the like) by plating the perforated core substrate 1010. In an implementation in which the plating is performed via electroless plating (or autocatalytic plating), the perforated core substrate 1010 can be immersed into an electroless bath contained in a vat, the bath including an aqueous solution of metal ions (e.g., Cu ions), reducing agents and other agents, and bath stabilizers. As illustrated, the metal coated substrate 1020 includes a metal layer 1022 and a metal layer 1024. In one aspect, formation of such metal layers can result in a metal structure 1028 at the outer region of the metal coated substrate 1020. The metal structure 1028 is larger than the precursor metal structure 948 (see FIG. 9D) and, as illustrated, the metal structure 1028 includes a metal trench (which also may be referred to as via layer).

Figure 10C:
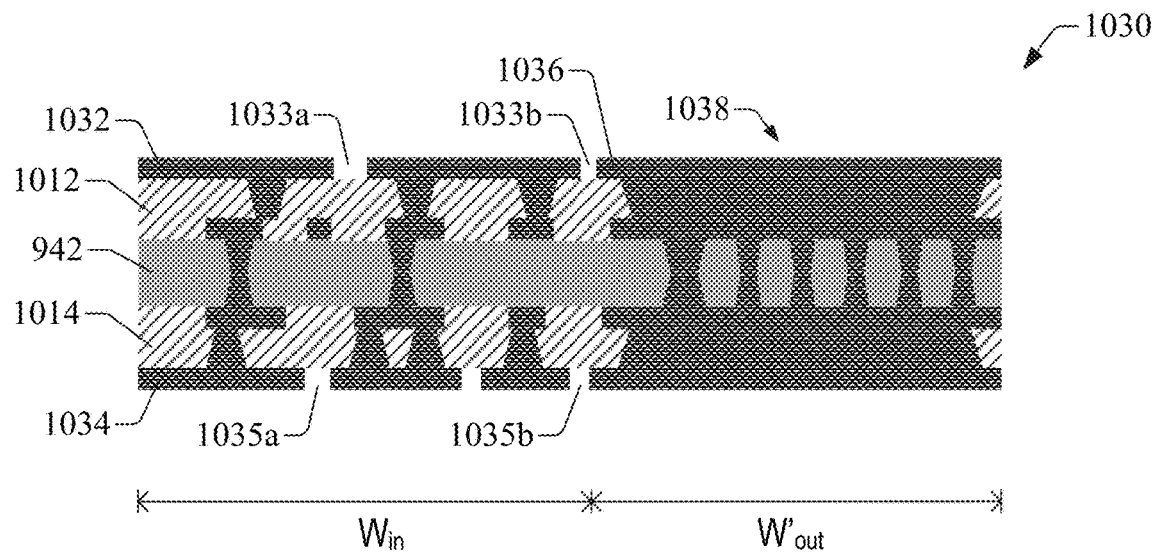

The metal coated substrate 1020 can be treated to remove portions of the metal (e.g., Cu, Ni, W, Ag, Au, Pt, or the like) from the metal layer 1022 and the metal layer 1024. To that end, in some implementations, the metal coated substrate 1020 can be lithographically patterned by depositing mask material (e.g., a dielectric material) that defines areas for removal of metal, and subsequently etched via selective metal etching during a defined period, for example. In some embodiments, the selective metal etching can include wet etching, where the patterned substrate can be immersed, during the defined period, into a vat containing an etching solution that can selectively remove the metal (e.g., Cu, Ni, W, Ag, Au, Pt, or the like). As mentioned, the etching solution can include, for example, ferric chloride or another metallurgic etching solution. In other embodiments, dry etching can be utilized for selective metal removal. Further, remaining mask material can be stripped off. As illustrated in FIG. 10C, removing the portions of the metal can result in a first metal layer 1032 and a second metal layer 1034. The first metal layer 1032 can embody or can include another top routing layer (or front layer) on a top surface of the perforated build-up layer 1012. The second metal layer 1034 can embody or can include another bottom routing layer (or back layer) on a bottom surface of the perforated build-up layer 1014. Such a top routing layer and bottom routing layer include respective groups of metal pads resulting from the selective metal etching. In addition, in one example, the first metal layer 1032 can define a plurality of openings, including an opening 1033a and an opening 1033b, and the second metal layer 1034 can include another plurality of openings, including an opening 1035a and an opening 1035b. A spatial arrangement of the openings in the first metal layer 1032 and a second spatial arrangement of the openings in the second metal layer 1034 can be determined by a specific routing design of the metal coated substrate 1030.

The selective metal removal also can yield a metal structure 1036 which constitutes a stiffener metal structure 1038 integrated into the package substrate being formed according to the example process described herein. As such, a top layer and a bottom layer of the metal structure 1036 do not include intentionally formed recesses or other types of openings. As illustrated, the stiffener metal structure 1038 includes an extended region of metal and a portion of metal vias (LTH vias) intercalated with a dielectric material forming the core layer 942. In accordance with aspects of this disclosure, the stiffener metal structure 1038 can have a width $W'_{out}$, extending from an edge surface of the metal coated substrate 1020 to the interior of the metal coated substrate 1020 along a direction transversal to the stacking direction.

Figure 10D:
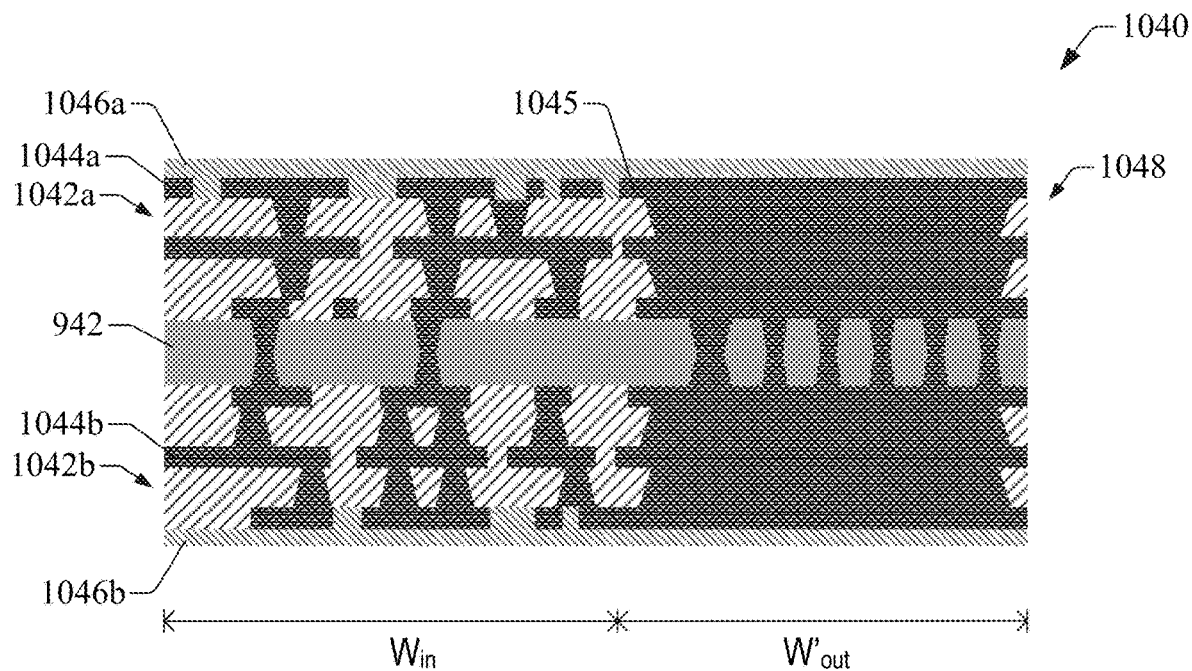

The example process can continue with additional treatments of the metal coated substrate 1030, the treatments resulting in the package substrate 1040 shown in FIG. 10D. Thus, in one example, the metal coated substrate 1030 can be covered with an amount of a dielectric material (e.g., ABF or other types of epoxy resin; fiberglass sheets; FR-4 materials; FR-5 materials; or the like), resulting in a top build-up layer and a bottom build-up layer, each of which layers can be treated to form perforations therein, resulting in perforated build-up layers. As described herein, first perforations in the top build-up layer can have a different arrangement from that of second perforations in the bottom build-up layer. In addition, the first perforations can include a group of holes within the inner region of the metal coated substrate 1030 and one or more trenches within the outer region of the metal coated substrate 1030. As described herein, the group of holes and the one or more trenches can be defined lithographically instead of by utilizing laser ablation. Perforations (including trenches) in the top build-up layer and the bottom build-up layer can be covered with respective amounts of metals. To that end, for example, numerous deposition processes can be utilized, including any one or a combination of CVD, ALD, PVD, sputtering, chemical solution deposition, plating, or the like. Coverage of the perforations can yield a build-up layer 1042a and a build-up layer 1042b.

Further, coverage of the perforations also can yield a top metal layer a bottom metal layer, both of which layers can be treated to form a top routing metal layer 1044a and a bottom routing metal layer 1044b. As discussed, such a treatment can permit adding top and bottom metal layers to the metal structure 1036, resulting in the metal structure 1045. As such, in some implementations, the top metal layer and the bottom metal layer can be lithographically patterned in order to define areas for metal removal (and formation of metal pads for routing) and to preserve the portions of metal coating the metal structure 1036. Subsequently, etching can be implemented to remove the metal according to the lithographic pattern, and remaining mask material can be stripped off in a dry film process. The formation of the metal structure 1045 results, in one aspect, in the stiffener metal structure 1048, which includes multiple trenches (or via layers) rather than cylindrical vias or metal pillars. As mentioned, the stiffener metal structure 1048 can be referred to as a metal moat structure.

The example process also can include covering the metal layer 1044a, the metal layer 1044b, and the metal structure 1045 with solder resist in order to finish the formation of a package substrate 1040 as is shown in FIG. 10D. Such SR lamination can be implemented via a paste deposition process or a dry film process. SR lamination yields a top SR layer 1046a and a bottom SR layer 1046b.

Figure 11:
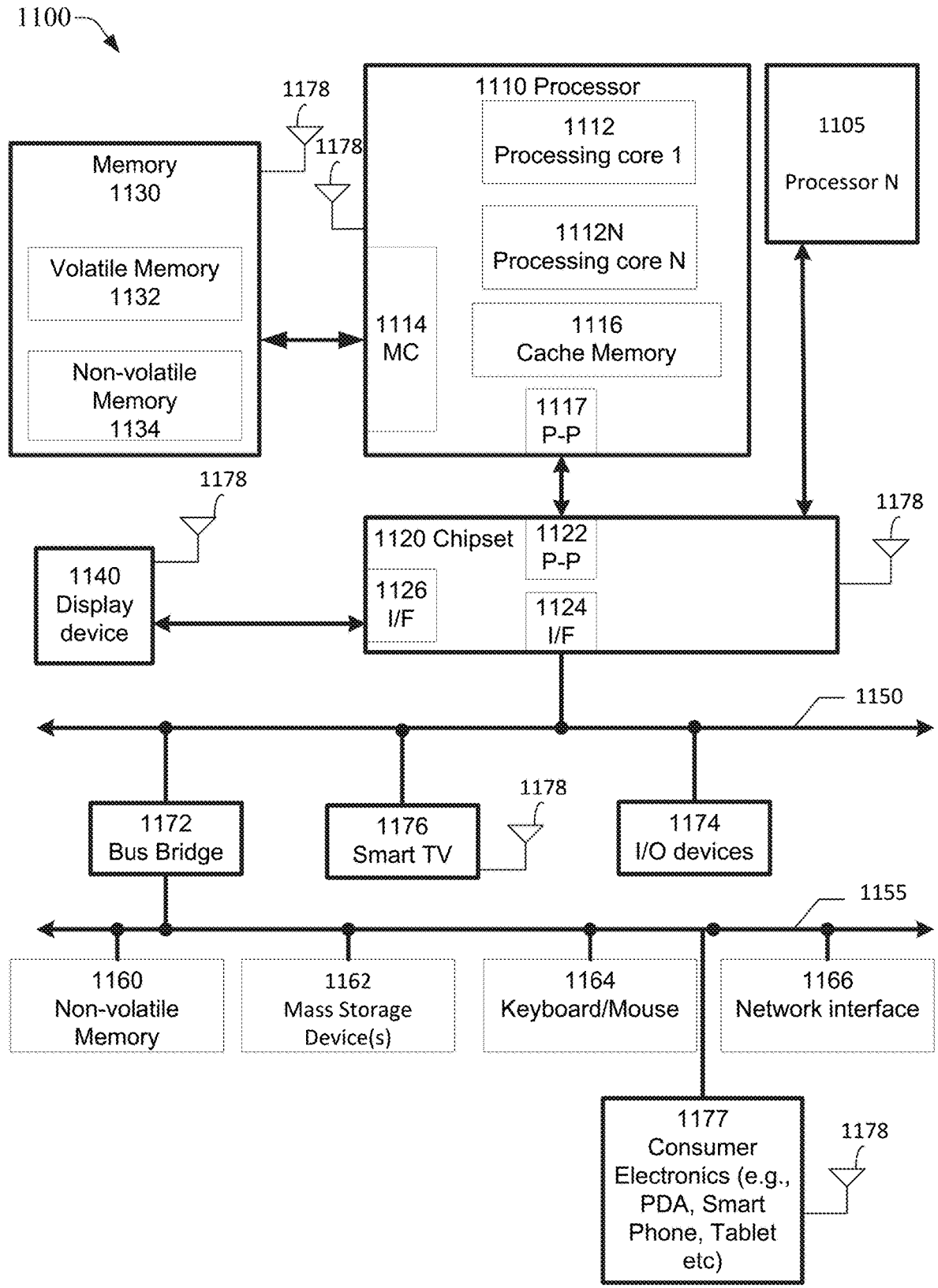
FIG. 11 illustrates an example of a system in accordance with one or more embodiments of the disclosure.

FIG. 11 depicts an example of a system 1100 according to one or more embodiments of the disclosure. In one embodiment, system 1100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1100 can include a system on a chip (SOC) system.

In one embodiment, system 1100 includes multiple processors including processor 1110 and processor N 1105, where processor N 1105 has logic similar or identical to the logic of processor 1110. In one embodiment, processor 1110 has one or more processing cores (represented here by processing core 1 1112 and processing core N 1112N, where 1112N represents the Nth processor core inside processor 1110, where N is a positive integer). More processing cores can be present (but not depicted in the diagram of FIG. 11). In some embodiments, processing core 1112 includes, but is not limited to, pre-fetch logic to fetch instructions, decode logic to decode the instructions, execution logic to execute instructions, a combination thereof, or the like. In some embodiments, processor 1110 has a cache memory 1116 to cache instructions and/or data for system 1100. Cache memory 1116 may be organized into a hierarchical structure including one or more levels of cache memory.

In some embodiments, processor 1110 includes a memory controller (MC) 1114, which is configured to perform functions that enable the processor 1110 to access and communicate with memory 1130 that includes a volatile memory 1132 and/or a non-volatile memory 1134. In some embodiments, processor 1110 can be coupled with memory 1130 and chipset 1120. Processor 1110 may also be coupled to a wireless antenna 1178 to communicate with any device configured to transmit and/or receive wireless signals. In one embodiment, the wireless antenna 1178 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1134 includes, but is not limited to, flash memory, phase change memory (PCM), read-only memory (ROM), electrically erasable programmable read-only memory (EEPROM), or any other type of non-volatile memory device.

Memory device 1130 stores information and instructions to be executed by processor 1110. In one embodiment, memory 1130 may also store temporary variables or other intermediate information while processor 1110 is executing instructions. In the illustrated embodiment, chipset 1120 connects with processor 1110 via Point-to-Point (PtP or P-P) interface 1117 and P-P interface 1122. Chipset 1120 enables processor 1110 to connect to other elements in system 1100. In some embodiments of the disclosure, P-P interface 1117 and P-P interface 1122 can operate in accordance with a PtP communication protocol, such as the Intel® QuickPath Interconnect (QPI) or the like. In other embodiments, a different interconnect may be used.

In some embodiments, chipset 1120 can be configured to communicate with processor 1110, the processor N 1105, display device 1140, and other devices 1172, 1176, 1174, 1160, 1162, 1164, 1166, 1177, etc. Chipset 1120 may also be coupled to the wireless antenna 1178 to communicate with any device configured to transmit and/or receive wireless signals.

Chipset 1120 connects to display device 1140 via interface 1126. Display 1140 may be, for example, a liquid crystal display (LCD), a plasma display, cathode ray tube (CRT) display, or any other form of visual display device. In some embodiments of the disclosure, processor 1110 and chipset 1120 are integrated into a single SOC. In addition, chipset 1120 connects to bus 1150 and/or bus 1155 that interconnect various elements 1174, 1160, 1162, 1164, and 1166. Bus 1150 and bus 1155 may be interconnected via a bus bridge 1172. In one embodiment, chipset 1120 couples with a non-volatile memory 1160, a mass storage device(s)

1162, a keyboard/mouse 1164, and a network interface 1166 via interface 1124 and/or 1104, smart TV 1176, consumer electronics 1177, etc.

In one embodiment, mass storage device(s) 1162 can include, but not be limited to, a solid state drive, a hard disk drive, a universal serial bus flash memory drive, or any other form of computer data storage medium. In one embodiment, network interface 1166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 11 are depicted as separate blocks within the system 1100, the functions performed by some of these blocks may be integrated within a single semiconductor circuit or may be implemented using two or more separate integrated circuits. For example, although cache memory 1116 is depicted as a separate block within processor 1110, cache memory 1116 or selected elements thereof can be incorporated into processor core 1112.

It is noted that the system 1100 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-4), as disclosed herein, may be provided in any variety of electronic device including consumer, industrial, military, communications, infrastructural, and/or other electronic devices.

It is noted that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages, as disclosed herein, may be provided in any variety of electronic device including consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package is provided may be a computing device. Such a computing device may house one or more boards on which the semiconductor package connections may be disposed. The board may include a number of components including, but not limited to, a processor and/or at least one communication chip. The processor may be physically and electrically connected to the board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Numerous example embodiments emerge from the foregoing detailed description and the annexed drawings. According to some example embodiments, the disclosure provides a semiconductor package. The semiconductor package can include a first layer, a second layer opposite to the first layer; a first region bounded by the first layer and the second layer, the first region having a first surface in contact with the first layer and a second surface in contact with the second layer; and a second region enclosing the first region and bounded by the first layer and the second layer, the second region being in contact with the first region and having a first assembly of conductive layers and a second assembly of conductive interconnects, wherein a portion of the second region extends a defined distance from an edge surface towards the first region along a first direction perpendicular to the edge surface.

Implementation can include one or more of the following elements. The defined distance can have a magnitude in a range from about 50 μm to about 2 mm and can be substantially uniform along a second direction perpendicular to the first direction. The first and second layers can be solder resist layers and the first region can include a first stack of metal layer and a second stack of dielectric layers. The dielectric layer of the first region can further have a substantially uniform thickness in a range from about 10 μm to about 100 μm. The first subset of the metal layers can be disposed above a first surface of the second dielectric layer and the second subset of metal layers can be disposed below a second surface of the dielectric layer, the second surface opposite to the first surface. The third subset of the second stack of dielectric layers can be disposed above the first surface and a fourth subset of the second stack of dielectric layers can be disposed below the second surface. The first assembly of conductive layers in the semiconductor package can include a first stack of first metal layers. The second assembly of conductive interconnects can include a second stack of second metal layers and can be intercalated between the first metal layers. Any one of a conductive layer of the first assembly of conductive layers or a conductive interconnect of the second assembly of conductive interconnects can include copper, aluminum, tungsten, silver, gold, palladium, platinum, zinc, nickel, or an alloy of two or more of the foregoing metals. The semiconductor package can further include a third region partitioning the first region into a first sub-region and a second sub-region, the third region bounded by the first layer and the second layer and in contact with the second region, wherein the third region includes having a third assembly of conductive layers and a fourth assembly of conductive interconnects.

According to other example embodiments, the disclosure provides a system. The system can include a package substrate having a first layer and a second layer opposite to the first layer. The package substrate can include a first region bounded by the first layer and the second layer, the first region having a first surface in contact with the first layer and a second surface in contact with the second layer; and a second region enclosing the first region and bounded by the first layer and the second layer, the second region being in contact with the first region and having a first assembly of conductive layers and a second assembly of conductive interconnects; a semiconductor die having circuitry fabricated thereon, the semiconductor die mounted on the package substrate; and a board substrate having the package substrate mounted thereon.

Implementation can include one or more of the following elements. The first region of the system can include a dielectric layer having a substantially uniform thickness in a range from about 10 μm to about 100 μm. The second assembly of conductive interconnects can include a first plurality of metal members interlocked with a second plurality of metal members. The first assembly of conductive layers can include a first stack of first metal layers. The second assembly of conductive interconnects can include a second stack of second metal layers, the second metal layers intercalated between the first metal layers. Any one of a conductive layer of the first assembly of conductive layers or a conductive interconnect of the second assembly of conductive interconnects can include copper, aluminum, tungsten, silver, gold, palladium, platinum, zinc, nickel, or an alloy of two or more of the foregoing metals.

According to yet other example embodiments, the disclosure can provide a method. The method can include forming a plurality of through holes in an outer region of a substrate having an upper planar surface and a lower planar surface opposite to the upper surface; forming an upper metal layer within the outer region, the upper metal layer in contact with at least a portion of the upper planar surface; and forming a first plurality of metal layers within the outer region, the first plurality of metal layers stacked on the upper layer along a stacking direction, the forming the first plurality of metal layers comprising forming one or more first metal interconnects coupling a first metal layer of the plurality of metal layers and a second metal layer of the plurality of metal layers, the first metal layer and the second metal layer consecutively stacked.

Implementation can include on or more of the following elements. The method of forming the one or more first metal interconnects can include forming a plurality of metal pillars embedded in a dielectric layer and can include forming a metal layer in contact with the first metal layer and the second metal layer. Forming the metal layer can include generating a lithographic pattern that defines an area for removal of dielectric material in a dielectric layer in contact with the first metal layer, removing an amount of the dielectric material from the dielectric layer within the area for removal of dielectric material, resulting in recess in the dielectric layer, and depositing a second amount of a metal on the recess, resulting in the metal layer. The method can further include forming a lower metal layer within the outer region, the lower metal layer in contact with at least a portion of the lower planar surface. The method can further include forming a second plurality of metal layers within the outer region, the second plurality of metal layers stacked on the lower layer along the stacking direction, the forming the second plurality of metal layers comprising forming one or more second metal interconnects between a third metal layer of the second plurality of metal layers and a fourth metal layer of the second plurality of metal layers, the third metal layer and the fourth metal layer consecutively stacked. The method can further include forming the one or more second metal interconnects can include forming a metal layer in contact with the third metal layer and the fourth metal layer and can include forming a plurality of metal pillars embedded in a dielectric layer. Forming the upper metal layer can further include filling a first portion of the plurality of through holes, and wherein forming the lower metal layer includes filling a second portion of the plurality of through holes.

According to further example embodiments, the disclosure can provide an electronic device. The electronic device can include first circuitry comprising one or more processing units; second circuitry comprising one or more storage units; and a semiconductor package coupled to the first circuitry via die-to-package interconnects and further coupled to the second circuitry via second die-to-package interconnects. The semiconductor package can include a first layer, a second layer opposite to the first layer; a first region bounded by the first layer and the second layer, the first region having a first surface in contact with the first layer and a second surface in contact with the second layer; and a second region enclosing the first region and bounded by the first layer and the second layer, the second region being in contact with the first region and having a first assembly of conductive layers and a second assembly of conductive interconnects, wherein a portion of the second region extends a defined distance from an edge surface towards the first region along a first direction perpendicular to the edge surface.

Implementation can include one or more of the following elements. The defined distance can have a magnitude in a range from about 50 µm to about 2 mm and can be substantially uniform along a second direction perpendicular to the first direction. The first and second layers can be solder resist layers and the first region can include a first stack of metal layer and a second stack of dielectric layers. The dielectric layer of the first region can further have a substantially uniform thickness in a range from about 10 µm to about 100 µm. The first subset of the metal layers can be disposed above a first surface of the second dielectric layer and the second subset of metal layers can be disposed below a second surface of the dielectric layer, the second surface opposite to the first surface. The third subset of the second stack of dielectric layers can be disposed above the first surface and a fourth subset of the second stack of dielectric layers can be disposed below the second surface. The first assembly of conductive layers in the semiconductor package can include a first stack of first metal layers. The second assembly of conductive interconnects can include a second stack of second metal layers and can be intercalated between the first metal layers. Any one of a conductive layer of the first assembly of conductive layers or a conductive interconnect of the second assembly of conductive interconnects can include copper, aluminum, tungsten, silver, gold, palladium, platinum, zinc, nickel, or an alloy of two or more of the foregoing metals. The electronic device comprising a microelectronics package can further include a third region partitioning the first region into a first sub-region and a second sub-region, the third region bounded by the first layer and the second layer and in contact with the second region, wherein the third region includes having a third assembly of conductive layers and a fourth assembly of conductive interconnects.

As mentioned, unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein is generally intended to include deposition of material or photoresist, patterning, exposure, development, etching, cleaning, ablating, polishing, and/or removal of the material or photoresist as required in forming a described structure.

What has been described herein in the present specification and annexed drawings includes examples of semiconductor package substrates with integrated stiffener regions and techniques that can provide such substrates. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. A semiconductor package, comprising:
   a first layer;
   a second layer opposite to the first layer;
   a first region bounded by the first layer and the second layer, the first region having a first surface in contact with the first layer and a second surface in contact with the second layer; and
   a second region enclosing the first region and bounded by the first layer and the second layer, the second region being in contact with the first region and having a first assembly of conductive layers and a second assembly of conductive interconnects, wherein a portion of the second region extends a defined distance from an edge surface towards the first region along a first direction perpendicular to the edge surface, wherein the first layer is a first solder resist layer and the second layer is a second solder resist layer, and wherein the first region comprises a first stack of metal layers and a second stack of dielectric layers.

2. The semiconductor package of claim 1, wherein the defined distance is substantially uniform along a second direction perpendicular to the first direction, and wherein the defined distance has a magnitude in a range from about 50 µm to about 2 mm.

3. The semiconductor package of claim 1, wherein the first region comprises a dielectric layer having a substantially uniform thickness in a range from about 10 µm to about 100 µm.

4. The semiconductor package of claim 3, wherein a first subset of the metal layers is disposed above a first surface of the dielectric layer, and wherein a second subset of the metal layers is disposed below a second surface of the dielectric layer, the second surface opposite to the first surface.

5. The semiconductor package of claim 3, wherein a first subset of the second stack of dielectric layers is disposed above the first surface, and wherein a second subset of the second stack of dielectric layers is disposed below the second surface.

6. The semiconductor package of claim 1, wherein the second assembly of conductive interconnects comprises a first plurality of metal members interlocked with a second plurality of metal members.

7. The semiconductor package of claim 1, wherein the first assembly of conductive layers comprises a first stack of first metal layers, and wherein the second assembly of conductive interconnects comprises a second stack of second metal layers, the second metal layers intercalated between the first metal layers.

8. The semiconductor package of claim 1, wherein a conductive layer of the first assembly of conductive layers comprises copper, aluminum, tungsten, silver, gold, palladium, platinum, zinc, nickel, or an alloy of two or more of the foregoing metals.

9. The semiconductor package of claim 1, wherein a conductive interconnect of the second assembly of conductive interconnects comprises copper, aluminum, tungsten, silver, gold, palladium, platinum, zinc, nickel, or an alloy of two or more of the foregoing metals.

10. The semiconductor package of claim 1, further comprising a third region partitioning the first region into a first sub-region and a second sub-region, the third region bounded by the first layer and the second layer and in contact with the second region, wherein the third region comprises having a third assembly of conductive layers and a fourth assembly of conductive interconnects.

11. A system, comprising:
a package substrate having a first layer and a second layer opposite to the first layer, the package substrate comprising:
a first region bounded by the first layer and the second layer, the first region having a first surface in contact with the first layer and a second surface in contact with the second layer; and
a second region enclosing the first region and bounded by the first layer and the second layer, the second region being in contact with the first region and having a first assembly of conductive layers and a second assembly of conductive interconnects;
a semiconductor die having circuitry fabricated thereon, the semiconductor die mounted on the package substrate; and
a board substrate having the package substrate mounted thereon, wherein the first assembly of conductive layers comprises a first stack of first metal layers, and wherein the second assembly of conductive interconnects comprises a second stack of second metal layers, the second metal layers intercalated between the first metal layers.

12. The system of claim 11, wherein the first region comprises a dielectric layer having a substantially uniform thickness in a range from about 10 µm to about 100 µm.

13. The system of claim 11, wherein the second assembly of conductive interconnects comprises a first plurality of metal members interlocked with a second plurality of metal members.

14. The system of claim 11, wherein a conductive layer of the first assembly of conductive layers comprises copper, aluminum, tungsten, silver, gold, palladium, platinum, zinc, nickel, or an alloy of two or more of the foregoing metals.

15. The system of claim 11, wherein a conductive interconnect of the second assembly of conductive of interconnects comprises copper, aluminum, tungsten, silver, gold, palladium, platinum, zinc, nickel, or an alloy of two or more of the foregoing metals.

16. A method, comprising:
forming a plurality of through holes in an outer region of a substrate having an upper planar surface and a lower planar surface opposite to the upper surface;
forming an upper metal layer within the outer region, the upper metal layer in contact with at least a portion of the upper planar surface; and
forming a first plurality of metal layers within the outer region, the first plurality of metal layers stacked on the upper layer along a stacking direction, the forming the first plurality of metal layers comprising forming one or more first metal interconnects coupling a first metal layer of the plurality of metal layers and a second metal layer of the plurality of metal layers, the first metal layer and the second metal layer consecutively stacked.

17. The method of claim 16, wherein the forming the one or more first metal interconnects comprises forming a plurality of metal pillars embedded in a dielectric layer.

18. The method of claim 16, wherein the forming the one or more first metal interconnects comprises forming a metal layer in contact with the first metal layer and the second metal layer.

* * * * *